US012501786B2

(12) United States Patent
He et al.

(10) Patent No.: US 12,501,786 B2
(45) Date of Patent: Dec. 16, 2025

(54) DISPLAY SUBSTRATE AND PREPARATION METHOD THEREOF, AND DISPLAY APPARATUS

(71) Applicant: BOE Technology Group Co., Ltd., Beijing (CN)

(72) Inventors: Jiayu He, Beijing (CN); Ce Ning, Beijing (CN); Zhengliang Li, Beijing (CN); Hehe Hu, Beijing (CN); Fengjuan Liu, Beijing (CN); Wei Liu, Beijing (CN); Tianmin Zhou, Beijing (CN); Kun Zhao, Beijing (CN)

(73) Assignee: Beijing BOE Technology Development Co., Ltd., Beijing (CN)

( * ) Notice: Subject to any disclaimer, the term of this patent is extended or adjusted under 35 U.S.C. 154(b) by 654 days.

(21) Appl. No.: 17/908,224

(22) PCT Filed: Nov. 4, 2021

(86) PCT No.: PCT/CN2021/128654
§ 371 (c)(1),
(2) Date: Aug. 30, 2022

(87) PCT Pub. No.: WO2022/199034
PCT Pub. Date: Sep. 29, 2022

(65) Prior Publication Data
US 2024/0215332 A1    Jun. 27, 2024

(30) Foreign Application Priority Data

Mar. 23, 2021  (CN) .......................... 202110309608.2

(51) Int. Cl.
*H10K 59/124*   (2023.01)
*H10D 30/67*    (2025.01)
(Continued)

(52) U.S. Cl.
CPC ....... *H10K 59/124* (2023.02); *H10D 30/6704* (2025.01); *H10D 30/6734* (2025.01);
(Continued)

(58) Field of Classification Search
CPC ...................................................... H10K 59/13
See application file for complete search history.

(56) References Cited

U.S. PATENT DOCUMENTS

2014/0110715 A1    4/2014  Lai et al.
2015/0187830 A1*   7/2015  Dai .................... G02F 1/13338
                                                          257/53
(Continued)

FOREIGN PATENT DOCUMENTS

CN    103779354 A    5/2014
CN    109252179 A    1/2019
(Continued)

OTHER PUBLICATIONS

International Searching Authority, Written Opinion of the International Searching Authority, International application No. PCT/CN2021/128654, Dec. 23, 2021, all pages. (Year: 2021).*
(Continued)

*Primary Examiner* — Victoria K. Hall
(74) *Attorney, Agent, or Firm* — Ling Wu; Stephen Yang; Ling and Yang Intellectual Property

(57) ABSTRACT

The present disclosure provides a display substrate and a preparation method thereof, and a display apparatus. The display substrate includes a circuit layer disposed on a base substrate, an emitting structure layer and a photoelectric structure layer disposed on a side of the circuit layer away from the base substrate, the circuit layer includes at least one impurity absorption layer and at least one transistor, the transistor includes an active layer, and at least one insulation layer is provided between the impurity absorption layer and
(Continued)

the active layer; an atomic ratio of a silicon element to a nitrogen element in the impurity absorption layer is 1:5 to 1:35.

20 Claims, 11 Drawing Sheets

(51) Int. Cl.
    *H10K 39/34*     (2023.01)
    *H10K 59/12*     (2023.01)
    *H10K 59/121*     (2023.01)
    *H10K 59/13*     (2023.01)
    *H10K 59/60*     (2023.01)
    *H10D 86/40*     (2025.01)
    *H10D 86/60*     (2025.01)

(52) U.S. Cl.
    CPC .......... *H10K 39/34* (2023.02); *H10K 59/1201* (2023.02); *H10K 59/1213* (2023.02); *H10K 59/13* (2023.02); *H10K 59/60* (2023.02); *H10D 30/6755* (2025.01); *H10D 86/423* (2025.01); *H10D 86/60* (2025.01)

(56) References Cited

U.S. PATENT DOCUMENTS

| | | | |
|---|---|---|---|
| 2020/0251687 A1 | 8/2020 | Jia et al. | |
| 2021/0320278 A1* | 10/2021 | Chung | ................ H10K 50/844 |
| 2022/0415933 A1 | 12/2022 | Liu et al. | |

FOREIGN PATENT DOCUMENTS

| | | |
|---|---|---|
| CN | 109786579 A | 5/2019 |
| CN | 109841632 A | 6/2019 |
| CN | 111668237 A | 9/2020 |
| CN | 112331675 A | 2/2021 |
| CN | 113078192 A | 7/2021 |

OTHER PUBLICATIONS

International Searching Authority, International Search Report, International application No. PCT/CN2021/128654, Dec. 23, 2021, all pages. (Year: 2021).*
International Search Report for PCT/CN2021/128654 Mailed Dec. 23, 2021.

* cited by examiner

DISPLAY SUBSTRATE AND PREPARATION METHOD THEREOF, AND DISPLAY APPARATUS

CROSS-REFERENCE TO RELATED APPLICATIONS

The present application is a U.S. National Phase Entry of International Application No. PCT/CN2021/128654 having an international filing date of Nov. 4, 2021, which claims priority to Chinese Patent Application No. 202110309608.2 filed to the CNIPA on Mar. 23, 2021 and entitled "Display Substrate and Preparation Method therefor, and Display Apparatus". The entire contents of the above-identified applications are hereby incorporated by reference.

TECHNICAL FIELD

The present disclosure relates to, but is not limited to, the field of display technologies, and in particular to a display substrate and a preparation method thereof, and a display apparatus.

BACKGROUND

An Organic Light Emitting Diode (OLED) is an active light emitting display device, which has advantages of auto-luminescence, a wide viewing angle, a high contrast ratio, low power consumption, an extremely high response speed, lightness and thinness, bendability, and a low cost, etc. With continuous development of display technologies, a display apparatus using an OLED as a light emitting device and using a Thin Film Transistor (TFT) for signal control has become a mainstream product in the field of display at present.

Although OLED display apparatuses have been widely used, there are still many technical problems, such as a compensation technology. The compensation technology is mainly used for overcoming defects such as uneven brightness and afterimage, so as to improve display quality of display apparatuses. At present, the compensation technology includes an electrical compensation technology and an optical compensation technology. Due to a limited effect of the electrical compensation technology, the optical compensation technology is used for some OLED display apparatuses, a photosensitive sensor is set in a sub-pixel, an intensity of outgoing light is sensed by the photosensitive sensor, and a signal detected by the photosensitive sensor is fed back to a pixel drive circuit to achieve corresponding compensation.

SUMMARY

The following is a summary of subject matters described herein in detail. The summary is not intended to limit the protection scope of claims.

The present disclosure provides a display substrate including a circuit layer disposed on a base substrate, an emitting structure layer and a photoelectric structure layer disposed on a side of the circuit layer away from the base substrate, wherein the circuit layer includes at least one impurity absorption layer and at least one transistor, the transistor includes an active layer, and at least one insulation layer is provided between the impurity absorption layer and the active layer; an atomic ratio of a silicon element to a nitrogen element in the impurity absorption layer is 1:5 to 1:35.

In an exemplary implementation mode, the atomic ratio of the silicon element to the nitrogen element in the impurity absorption layer is 1:10 to 1:25.

In an exemplary implementation mode, the atomic ratio of the silicon element to a hydrogen element in the impurity absorption layer is 1:5 to 1:30.

In an exemplary implementation mode, the atomic ratio of the silicon element to the hydrogen element in the impurity absorption layer is 1:5 to 1:15.

In an exemplary implementation mode, a material of the impurity absorption layer includes any one or more of following: silicon nitride, silicon oxynitride, and silicon aluminum nitride.

In an exemplary implementation mode, the display substrate includes a light emitting region and a sensing region; the circuit layer includes a drive circuit layer disposed in the light emitting region and a sensing circuit layer disposed in the sensing region, the drive circuit layer includes a first transistor, the sensing circuit layer includes a second transistor, the emitting structure layer is disposed on a side of the drive circuit layer away from the base substrate, and the photoelectric structure layer is disposed on a side of the sensing circuit layer away from the base substrate; the emitting structure layer includes an anode, an organic emitting layer, and a cathode; the photoelectric structure layer includes a photodiode and an electrode lead; and the anode is arranged in a same layer as the electrode lead.

In an exemplary implementation mode, a thickness of the impurity absorption layer is 200 Å to 1000 Å and a thickness of the photodiode is 0.8 μm to 1.2 μm.

In an exemplary implementation mode, the drive circuit layer includes: a first shield layer disposed on the base substrate, an impurity absorption layer disposed on a side of the first shield layer away from the base substrate, a first insulation layer disposed on a side of the impurity absorption layer away from the base substrate, and a first transistor disposed on a side of the first insulation layer away from the base substrate; the sensing circuit layer includes: a second shield layer disposed on the base substrate, an impurity absorption layer disposed on a side of the second shield layer away from the base substrate, a first insulation layer disposed on a side of the impurity absorption layer away from the base substrate, and a second transistor disposed on a side of the first insulation layer away from the base substrate.

In an exemplary implementation mode, the first transistor includes: a first active layer disposed on a side of a first insulation layer away from the base substrate, a second insulation layer disposed on a side of the first active layer away from the base substrate, a first gate electrode disposed on a side of the second insulation layer away from the base substrate, a third insulation layer disposed on a side of the first gate electrode away from the base substrate, a first source electrode and a first drain electrode disposed on a side of the third insulation layer away from the base substrate, and the first source electrode is connected with the first shield layer through a via; a second active layer of the second transistor is arranged in a same layer as the first active layer, a second gate electrode of the second transistor is arranged in a same layer as the first gate electrode, and a second source electrode and a second drain electrode of the second transistor are arranged in a same layer as the first source electrode and the first drain electrode.

In an exemplary implementation mode, the sensing circuit layer further includes a fourth insulation layer disposed on a side of the second transistor away from the base substrate, a planarization island disposed on a side of the fourth insulation layer away from the base substrate, the planarization island is disposed in the sensing region, and the photodiode is disposed on a side of the planarization island away from the base substrate.

In an exemplary implementation mode, the photodiode includes a first electrode disposed on a side of the planarization island away from the base substrate, and a first doped layer, an intrinsic layer, a second doped layer, and a second electrode disposed in sequence on the first electrode, the first electrode is connected with a second drain electrode of the second transistor through a via, and the second electrode is connected with the electrode lead through a via; each of the planarization island, the first electrode, and the second electrode is in a shape of a rectangle with a long side extending along a first direction; in a second direction, an orthographic projection of an edge of the first electrode on the base substrate is within a range of an orthographic projection of an edge of the planarization island on the base substrate, and a first distance between the edge of the first electrode and the edge of the planarization island is 2 μm to 4 μm; an orthographic projection of an edge of the second electrode on the base substrate is within a range of the orthographic projection of the edge of the first electrode on the base substrate, and a distance between the edge of the second electrode and the edge of the first electrode is 1.5 μm to 5.5 μm; wherein the second direction intersects the first direction.

The present disclosure further provides a display apparatus, which includes the aforementioned display substrate.

The present disclosure further provides a preparation method of a display substrate, which includes: forming a circuit layer on a base substrate; wherein the circuit layer includes at least one impurity absorption layer and at least one transistor, the transistor includes an active layer, and at least one insulation layer is provided between the impurity absorption layer and the active layer; an atomic ratio of a silicon element to a nitrogen element in the impurity absorption layer is 1:5 to 1:35; and forming an emitting structure layer and a photoelectric structure layer on the circuit layer.

In an exemplary implementation mode, the forming the circuit layer on the base substrate includes: forming a first metal layer on the base substrate; depositing an impurity absorption thin film on a side of the first metal layer away from the base substrate, performing a plasma treatment on the impurity absorption thin film to form an impurity absorption layer covering the first metal layer; forming a first insulation layer on a side of the impurity absorption layer away from the base substrate; and forming a first transistor and a second transistor on a side of the first insulation layer away from the base substrate.

In an exemplary implementation mode, the depositing the impurity absorption thin film includes: depositing the impurity absorption thin film with a thickness of 200 Å to 1000 Å in a chemical vapor deposition manner under a deposition power of 500 W to 1200 W, a deposition temperature of 330° C. to 450° C., and a deposition pressure of 1000 mT to 1800 mT, a material of the impurity absorption thin film includes any one or more of following: silicon nitride, silicon oxynitride, and silicon aluminum nitride.

In an exemplary implementation mode, the performing the plasma treatment on the impurity absorption thin film includes: performing the plasma treatment on the impurity absorption thin film using nitrous oxide under a plasma power of 600 W to 1500 W and a plasma pressure of 600 mT to 2000 mT.

Other aspects may be understood upon reading and understanding drawings and detailed description.

BRIEF DESCRIPTION OF DRAWINGS

Accompanying drawings are used for providing further understanding of technical solutions of the present disclosure, constitute a part of the specification, and together with the embodiments of the present disclosure, are used for explaining the technical solutions of the present disclosure but not to constitute limitations on the technical solutions of the present disclosure. Shapes and sizes of various components in the drawings do not reflect actual scales, and are only intended to schematically illustrate contents of the present disclosure.

Figure 1:
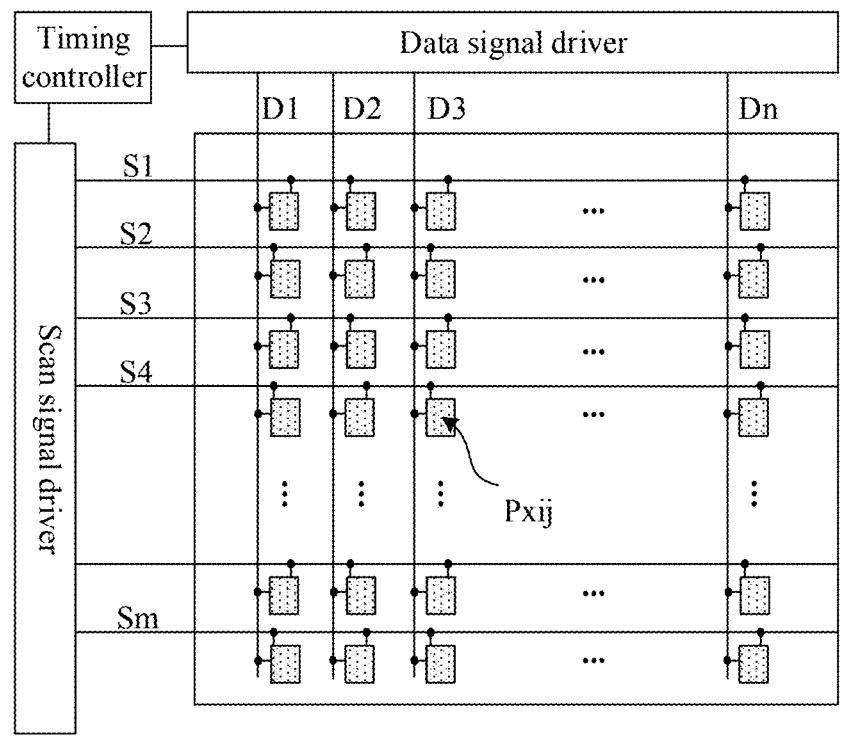
FIG. 1 is a schematic diagram of a structure of a display apparatus.

In the specification, for convenience, wordings indicating directional or positional relationships, such as "middle", "upper", "lower", "front", "back", "vertical", "horizontal", "top", "bottom", "inside", and "outside", are used for illustrating positional relationships between constituent elements with reference to the drawings, and are merely for facilitating the description of the specification and simplifying the description, rather than indicating or implying that a referred apparatus or element must have a particular orientation and be constructed and operated in the particular orientation. Therefore, they cannot be understood as limitations on the present disclosure. The positional relationships between the constituent elements may be changed as appropriate according to directions for describing the constituent elements. Therefore, appropriate replacements may be made according to situations without being limited to the wordings described in the specification.

In the specification, unless otherwise specified and defined explicitly, terms "mount", "mutually connect", and "connect" should be understood in a broad sense. For example, a connection may be a fixed connection, or a detachable connection, or an integrated connection. It may be a mechanical connection or an electrical connection. It

| | | |
|---|---|---|
| 10-base substrate; | 11-first insulation layer; | 12-second insulation layer; |
| 13-third insulation layer; | 14-fourth insulation layer; | 15-fifth insulation layer; |
| 16-sixth insulation layer; | 18-first planarization layer; | 19-second planarization layer; |
| 20-planarization island; | 31-first shield layer; | 32-first active layer; |
| 33-first gate electrode; | 34-first source electrode; | 35-first drain electrode; |
| 41-second shield layer; | 42-second active layer; | 43-second gate electrode; |
| 44-second source electrode; | 45-second drain electrode; | 61-connection electrode; |
| 71-first electrode; | 72-first doped layer; | 73-intrinsic layer; |
| 74-second doped layer; | 75-second electrode; | 81-anode; |
| 82-pixel definition layer; | 83- organic emitting layer; | 84-cathode; |
| 85-color film layer; | 91-electrode lead; | 100-impurity absorption layer; |
| 101-drive circuit layer; | 102-emitting structure layer; | 110-first transistor; |
| 201-sensing circuit layer; | 202-photoelectric structure layer; | 210-second transistor. |

DETAILED DESCRIPTION

To make objectives, technical solutions, and advantages of the present disclosure clearer, the embodiments of the present disclosure will be described in detail with reference to the accompanying drawings. It is to be noted that implementation modes may be implemented in multiple different forms. Those of ordinary skills in the art may easily understand such a fact that modes and contents may be transformed into various forms without departing from the purpose and scope of the present disclosure. Therefore, the present disclosure should not be explained as being limited to contents described in following implementation modes only. The embodiments in the present disclosure and features in the embodiments may be combined randomly with each other without conflict.

In the drawings, a size of each constituent element, a thickness of a layer, or a region is exaggerated sometimes for clarity. Therefore, one mode of the present disclosure is not necessarily limited to the size, and shapes and sizes of various components in the drawings do not reflect actual scales. In addition, the drawings schematically illustrate ideal examples, and one mode of the present disclosure is not limited to shapes, numerical values, or the like shown in the drawings.

Ordinal numerals such as "first", "second", and "third" in the specification are set to avoid confusion of constituent elements, but not to set a limit in quantity.

may be a direct mutual connection, or an indirect connection through middleware, or internal communication between two components. Those of ordinary skill in the art may understand specific meanings of these terms in the present disclosure according to specific situations.

In the specification, a transistor refers to an element which at least includes three terminals, i.e., a gate electrode, a drain electrode, and a source electrode. The transistor has a channel region between the drain electrode (drain electrode terminal, drain region, or drain) and the source electrode (source electrode terminal, source region, or source), and a current can flow through the drain electrode, the channel region, and the source electrode. It is to be noted that, in the specification, the channel region refers to a region through which the current mainly flows.

In the specification, a first electrode may be the drain electrode, and a second electrode may be the source electrode. Or, the first electrode may be the source electrode, and the second electrode may be the drain electrode. In cases that transistors with opposite polarities are used, a direction of a current is changed during operation of a circuit, or the like, and functions of the "source electrode" and the "drain electrode" are sometimes interchangeable. Therefore, the "source electrode" and the "drain electrode" are interchanged in the specification.

In the specification, an "electrical connection" includes a case that constituent elements are connected together through an element with some electrical action. The "element with some electrical action" is not particularly limited as long as electrical signals may be sent and received between the connected constituent elements. Examples of the "element with some electrical action" not only include electrodes and wirings, but also include switching elements such as transistors, resistors, inductors, capacitors, and other elements with various functions, etc.

In the specification, "parallel" refers to a state in which an angle formed by two straight lines is above −10° and below 10°, and thus also includes a state in which the angle is above −5° and below 5°. In addition, "perpendicular" refers to a state in which an angle formed by two straight lines is above 80° and below 100°, and thus also includes a state in which the angle is above 85° and below 95°.

In the specification, a "film" and a "layer" are interchangeable. For example, a "conductive layer" may be replaced with a "conductive film" sometimes. Similarly, an "insulation film" may be replaced with an "insulation layer" sometimes.

In the present disclosure, "about" refers to that a boundary is defined not so strictly and numerical values within process and measurement error ranges are allowed.

FIG. 1 is a schematic diagram of a structure of a display apparatus. Referring to FIG. 1, an OLED display apparatus may include a timing controller, a data signal driver, a scan signal driver, and a pixel array. The pixel array may include multiple scan signal lines (S1 to Sm), multiple data signal lines (D1 to Dn), and multiple sub-pixels Pxij. In an exemplary implementation mode, the timing controller may provide a gray scale value and a control signal suitable for the specification of the data signal driver to the data signal driver, and may provide a clock signal, a scan start signal, and the like suitable for the specification of the scan signal driver to the scan signal driver. The data signal driver may generate a data voltage to be provided to data signal lines D1, D2, D3, . . . , and Dn using the gray scale value and the control signal received from the timing controller. For example, the data signal driver may sample the gray scale value using the clock signal and apply a data voltage corresponding to the gray scale value to the data signal lines D1 to Dn taking a sub-pixel row as a unit, wherein n may be a natural number. The scan signal driver may generate a scan signal to be provided to scan signal lines S1, S2, S3, . . . , and Sm by receiving a clock signal, a scan start signal, and the like from the timing controller. For example, the scan signal driver may sequentially provide a scan signal with an on-level pulse to the scan signal lines S1 to Sm. For example, the scan signal driver may be constructed in a form of a shift register and may generate a scan signal in a manner of sequentially transmitting a scan starting signal provided in a form of an on-level pulse to a next-stage circuit under control of a clock signal, wherein m may be a natural number. An array of sub-pixels may include multiple sub-pixels PXij. Each sub-pixel PXij may be connected to a corresponding data signal line and a corresponding scan signal line, wherein i and j may be natural numbers. The sub-pixel Pxij may refer to a sub-pixel in which a transistor is connected to an i-th scan signal line and is connected to a j-th data signal line.

Figure 2:
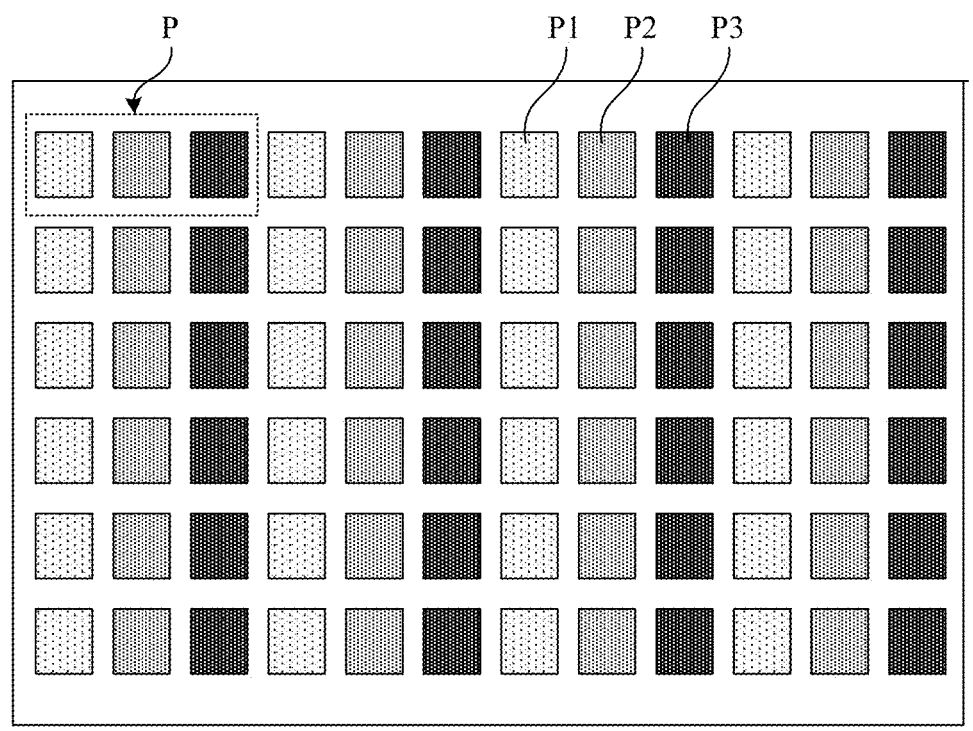
FIG. 2 is a schematic diagram of a planar structure of a display substrate.

FIG. 2 is a schematic diagram of a planar structure of a display substrate. As shown in FIG. 2, the display substrate may include multiple pixel units P arranged in a matrix, at least one of the multiple pixel units P includes a first sub-pixel P1 emitting light of a first color, a second sub-pixel P2 emitting light of a second color, and a third sub-pixel P3 emitting light of a third color. The first sub-pixel P1, the second sub-pixel P2, and the third sub-pixel P3 each include a pixel drive circuit and a light emitting device. Pixel drive circuits in the first sub-pixel P1, the second sub-pixel P2, and the third sub-pixel P3 are respectively connected with a scan signal line and a data signal line. The pixel drive circuit is configured to receive a data voltage transmitted by the data signal line and output a corresponding current to the light emitting device under control of the scan signal line. The light emitting device in the first sub-pixel P1, the second sub-pixel P2, and the third sub-pixel P3 is respectively connected with a pixel drive circuit of a sub-pixel where the light emitting device is located, and is configured to emit light with corresponding brightness in response to a current output by the pixel drive circuit of the sub-pixel where the light emitting device is located.

In an exemplary implementation mode, a pixel unit P may include a Red (R) sub-pixel, a Green (G) sub-pixel, and a Blue (B) sub-pixel, or may include a red sub-pixel, a green sub-pixel, a blue sub-pixel, and a white sub-pixel, which is not limited in the present disclosure. In an exemplary implementation mode, a shape of a sub-pixel in the pixel unit may be a rectangle, a rhombus, a pentagon, or a hexagon. When the pixel unit includes three sub-pixels, the three sub-pixels may be arranged side by side horizontally, side by side vertically, or in a manner like a Chinese character "品", and when the pixel unit includes four sub-pixels, the four sub-pixels may be arranged side by side horizontally, side by side vertically, or in a manner to form a square, which is not limited in the present disclosure.

Figure 3:
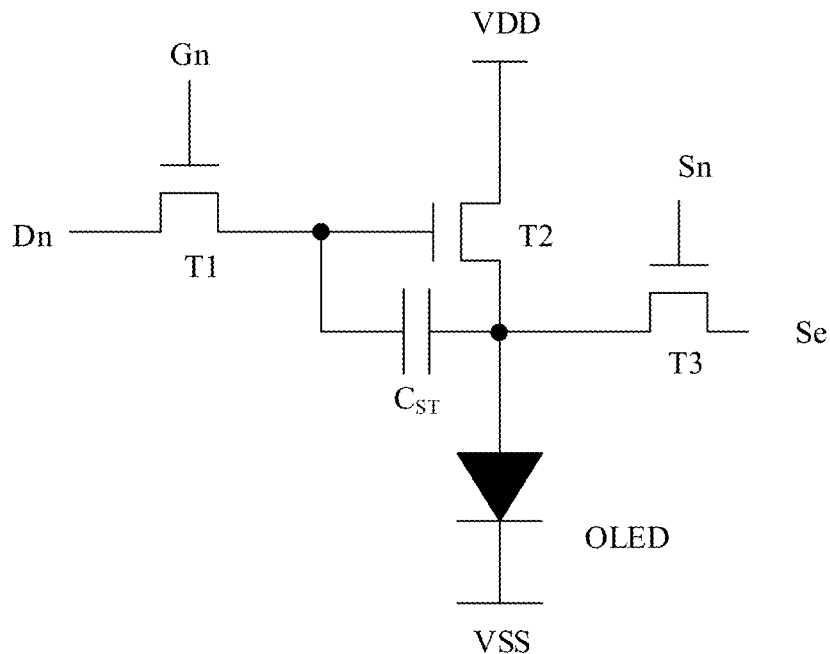
FIG. 3 is a schematic diagram of an equivalent circuit of a pixel drive circuit.

In an exemplary implementation mode, the pixel drive circuit may be of a 3T1C, 4T1C, 5T1C, 5T2C, 6T1C, or 7T1C structure. FIG. 3 is a schematic diagram of an equivalent circuit of a pixel drive circuit. As shown in FIG. 3, the pixel drive circuit has a 3T1C structure, which may include three transistors (a first transistor T1, a second transistor T2, and a third transistor T3), one storage capacitor $C_{ST}$, and six signal lines (a data signal line Dn, a first scan signal line Gn, a second scan signal line Sn, a compensation signal line Se, a first power supply line VDD, and a second power supply line VSS). In an exemplary implementation mode, the first transistor T1 is a switching transistor, the second transistor T2 is a drive transistor, and the third transistor T3 is a compensation transistor. A gate electrode of the first transistor T1 is coupled to the first scan signal line Gn, a first electrode of the first transistor T1 is coupled to the data signal line Dn, a second electrode of the first transistor T1 is coupled to a gate electrode of the second transistor T2. The first transistor T1 is configured to receive a data signal transmitted by the data signal line Dn under control of the first scan signal line Gn, so that the gate electrode of the second transistor T2 receives the data signal. The gate electrode of the second transistor T2 is coupled to the second electrode of the first transistor T1, a first electrode of the second transistor T2 is coupled to the first power supply line VDD, a second electrode of the second transistor T2 is coupled to a first electrode of an OLED, and the second transistor T2 is configured to generate a corresponding current at the second electrode under control of the data signal received by the gate electrode of the second transistor. A gate electrode of the third transistor T3 is coupled to the second scan signal line Sn, a first electrode of the third transistor T3 is coupled to the compensation signal line Se, a second electrode of the third transistor T3 is coupled to the second electrode of the second transistor T2. The third transistor T3 is configured to extract a threshold voltage Vth and a mobility of the second transistor T2 in response to compensation timing to compensate the threshold voltage Vth. The first electrode of the OLED is coupled to the second electrode of the second transistor T2, a second electrode of the OLED is coupled to the second power supply line VSS, and the OLED is configured to emit light with corresponding brightness in response to a current of the second electrode of the second transistor T2. A first electrode of the storage capacitor $C_{ST}$ is coupled to the gate electrode of the second transistor T2, a second electrode of the storage capacitor $C_{ST}$ is coupled to the second electrode of the second transistor T2, and the storage capacitor $C_{ST}$ is configured to store a potential of the gate electrode of the second transistor T2.

In an exemplary implementation mode, a signal of the first power supply line VDD is a high-level signal continuously provided, and a signal of the second power supply line VSS is a low-level signal. The first transistor T1 to the third transistor T3 may be P-type transistors or may be N-type transistors. Use of a same type of transistors in a pixel drive circuit may simplify a process flow, reduce process difficulties of a display panel, and improve a product yield.

In an exemplary implementation mode, for the first transistor T1 to the third transistors T3, low temperature poly silicon thin film transistors may be adopted, oxide thin film transistors may be adopted, or low temperature poly silicon thin film transistors and oxide thin film transistors may be adopted. An active layer of a low temperature poly silicon thin film transistor is made of Low Temperature Poly Silicon (LTPS for short), and an active layer of an oxide thin film transistor is made of an oxide. The low temperature poly silicon thin film transistor has advantages of a high mobility, fast charging, and the like, and the oxide thin film transistor has advantages of a low leakage current and the like. In an exemplary implementation mode, a low temperature poly silicon thin film transistor and an oxide thin film transistor may be integrated on one display substrate to form a Low Temperature Polycrystalline Oxide (LTPO for short) display substrate, so that advantages of the two may be utilized, high Pixel Per Inch (PPI for short) and low-frequency drive may be achieved, power consumption may be reduced, and display quality may be improved. In an exemplary implementation mode, the light emitting device may be an Organic light emitting Diode (OLED), including a first electrode (anode), an organic emitting layer, and a second electrode (cathode) that are stacked.

In production of a display substrate using an optical compensation technology, there is a problem of unqualified display due to a large number of bright spots, which seriously affects a product yield. It is found from research that a problem of a large number of bright spots appearing in a display substrate using an optical compensation technology is caused to a certain extent by a process of preparing a photodiode. In an existing preparation process, gas atmosphere for preparing each film layer of a photodiode is mainly silicon tetrahydride ($SiH_4$) and hydrogen ($H_2$). Therefore, a display substrate is exposed to hydrogen atmosphere for a long time, a hydrogen element may easily penetrate into an oxide active layer of a thin film transistor, which makes the oxide active layer conductive, and the conductive oxide active layer will cause the thin film transistor to be in a state of a high current. In addition, a protective layer needs to be formed after the photodiode is prepared. Since the protective layer is relatively thick and in order to ensure quality of film formation, deposition time usually takes 10 minutes to 30 minutes, the display substrate will be also exposed to hydrogen atmosphere for a long time. Since the thin film transistor is in the state of the high current and it is difficult for a subsequent process to return to a normal state, a large number of bright spots appear in a dot screen, resulting in unqualified display.

An exemplary embodiment of the present disclosure provides a display substrate. In an exemplary implementation mode, a display substrate may include a circuit layer disposed on a base substrate and an emitting structure layer and a photoelectric structure layer disposed on a side of the circuit layer away from the base substrate, the circuit layer includes at least one impurity absorption layer and at least one transistor, wherein the transistor includes an active layer, and at least one insulation layer is provided between the impurity absorption layer and the active layer; an atomic ratio of a silicon element to a nitrogen element in the impurity absorption layer is 1:5 to 1:35; and the impurity absorption layer is configured to reduce penetration of hydrogen elements into the circuit layer, so as to ensure normal electrical characteristics of the transistor in the circuit layer, thereby avoiding a large number of bright spots on the display substrate and improving a yield.

Figure 4:
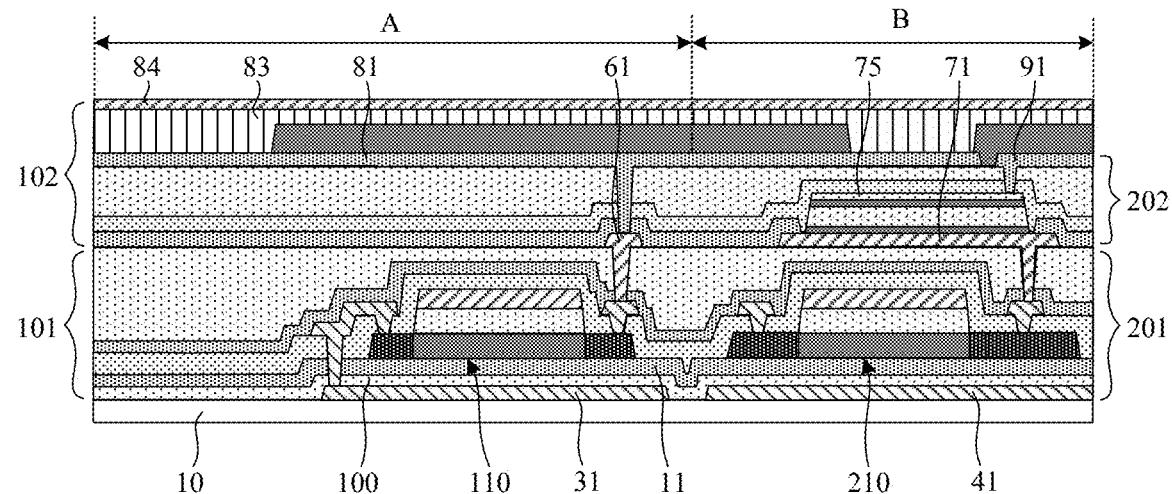
FIG. 4 is a schematic diagram of a sectional structure of a display substrate according to an exemplary embodiment of the present disclosure.

FIG. 4 is a schematic diagram of a sectional structure of a display substrate according to an exemplary embodiment of the present disclosure, and the display substrate is a bottom emission type display substrate. On a plane parallel to the display substrate, the display substrate may include multiple sub-pixels arranged in a matrix manner, and a structure of one sub-pixel of the display substrate is schematically illustrated in FIG. 4. As shown in FIG. 4, on a plane parallel to the display substrate, the sub-pixel may include a light emitting region A and a sensing region B. On a plane perpendicular to the display substrate, the display substrate may include a drive circuit layer 101 and an emitting structure layer 102 provided in the light emitting region A, and a sensing circuit layer 201 and a photoelectric structure layer 202 provided in the sensing region B. The drive circuit layer 101 and the sensing circuit layer 201 form the circuit layer of the present disclosure. The drive circuit layer 101 of the light emitting region A is provided on the base substrate 10, the emitting structure layer 102 is disposed on a side of the drive circuit layer 101 away from the base substrate, the sensing circuit layer 201 of the sensing region B is disposed on the base substrate 10, and the photoelectric structure layer 202 is disposed on a side of the sensing circuit layer 201 away from the base substrate. The emitting structure layer 102 is configured to emit light of corresponding brightness, and the photoelectric structure layer 202 is configured to sense an intensity of emitted light. In an exemplary implementation mode, the drive circuit layer 101 and the sensing circuit layer 201 include a transistor and an impurity absorption layer 100, the impurity absorption layer 100 is located on a side of an active layer of the transistor adjacent to the base substrate, and a first insulation layer is provided between the impurity absorption layer 100 and the active layer of the transistor. An atomic ratio of a silicon element to a nitrogen element in the impurity absorption layer 100 may be about 1:5 to 1:35. The impurity absorption layer is configured to reduce penetration of hydrogen elements, oxygen elements, and metal elements into transistors in the drive circuit layer 101 and the sensing circuit layer 201, so as to ensure normal electrical characteristics of the transistors, thereby avoiding a large number of bright spots on the display substrate and improving a yield.

In an exemplary implementation mode, the impurity absorption layer utilizes nitrogen elements in the impurity absorption layer to form an H=N bond, an N=O bond, and an N=M bond with hydrogen elements, oxygen elements, and metal elements, respectively, to effectively reduce penetration of hydrogen elements, oxygen elements, and metal elements into an active layer of a transistor. In an exemplary implementation mode, an atomic ratio of a silicon element to a nitrogen element is in a range of 1:5 to 1:35, combination energy of hydrogen elements and nitrogen elements for combining to form a bond is relatively strong, and when the atomic ratio of the silicon element to the nitrogen element is relatively small, bond energy is relatively small, and a hydrogen element is not easy to be fixed in the impurity absorption layer and will dissociate to an active layer. When the atomic ratio of the silicon element and the nitrogen element is relatively large, a hydrogen element can no longer be fixed after the bond energy is combined to be full, and an extra hydrogen element will also dissociate to the active layer.

In an exemplary implementation mode, an atomic ratio of a silicon element to a nitrogen element in the impurity absorption layer may be about 1:10 to 1:25. For example, the atomic ratio of the silicon element to the nitrogen element in the impurity absorption layer may be about 1:17.

In an exemplary implementation mode, for the impurity absorption layer, a nitrogen element and a hydrogen element in the impurity absorption layer is used for forming an H═N bond, so that the impurity absorption layer contains the hydrogen element, an atomic ratio of a silicon element to the hydrogen element in the impurity absorption layer is 1:5 to 1:30, wherein this proportional relationship is formed after the impurity absorption layer absorbs the hydrogen element.

In an exemplary implementation mode, an atomic ratio of a silicon element to a hydrogen element in the impurity absorption layer is 1:5 to 1:15. For example, the atomic ratio of the silicon element to the hydrogen element in the impurity absorption layer may be about 1:13.

In an exemplary implementation mode, a material of the impurity absorption layer 100 may be a silicon nitride compound and may include any one or more of following: silicon nitride, silicon oxynitride, and aluminum silicon nitride.

In an exemplary implementation mode, the drive circuit layer 101 of the light emitting region A may include a first shield layer 31 disposed on the base substrate, an impurity absorption layer 100 covering the first shield layer 31, a first insulation layer 11 disposed on a side of the impurity absorption layer 100 away from the base substrate, and a first transistor 110 disposed on a side of the first insulation layer 11 away from the base substrate. In an exemplary implementation mode, the first transistor 110 with a top gate structure may include a first gate electrode, a first active layer, a first source electrode, and a first drain electrode. A position of the first transistor 110 corresponds to a position of the first shield layer 31. An orthographic projection of the first active layer of the first transistor 110 on the base substrate is within a range of an orthographic projection of the first shield layer 31 on the base substrate. The first source electrode of the first transistor 110 is connected with the first shield layer 31 through a via to form the first transistor 110 with a double gate structure. In an exemplary implementation mode, the drive circuit layer 101 may include multiple transistors and a storage capacitor forming a pixel drive circuit, and FIG. 4 is illustrated by taking only one first transistor in a sub-pixel as an example.

In an exemplary implementation mode, the emitting structure layer 102 may include an anode 81, an organic emitting layer 83, and a cathode 84 forming a light emitting device. The anode 81 is connected with the first drain electrode of the first transistor 110, the organic emitting layer 83 is disposed between the anode 81 and the cathode 84, and the organic emitting layer 83 emits light of a corresponding color under control of the anode 81 and the cathode 84.

In an exemplary implementation mode, the sensing circuit layer 201 of the sensing region B may include a second shield layer 41 disposed on the base substrate, an impurity absorption layer 100 covering the second shield layer 41, a first insulation layer 11 disposed on a side of the impurity absorption layer 100 away from the base substrate, and a second transistor 210 disposed on a side of the first insulation layer 11 away from the base substrate as a switching device. In an exemplary implementation mode, the second transistor 210 with a top gate structure may include a second gate electrode, a second active layer, a second source electrode, and a second drain electrode. A position of the second transistor 210 corresponds to a position of the second shield layer 41, and an orthographic projection of the second active layer of the second transistor 210 on the base substrate is within a range of an orthographic projection of the second shield layer 41 on the base substrate.

In an exemplary implementation mode, the photoelectric structure layer 202 may include an electrode lead 91, and a first electrode 71, a first doped layer, an intrinsic layer, a second doped layer, and a second electrode 75 forming a Positive Intrinsic-Negative (PIN) photodiode. The first electrode 71 is connected with a second drain electrode of the second transistor 210 through a via, and the second electrode 75 is connected with the electrode lead 91 through a via.

In an exemplary implementation mode, the first transistor 110 of the drive circuit layer 101 and the second transistor 210 of the sensing circuit layer 201 are arranged in a same layer, and may be formed simultaneously through a same process. That is, a first gate electrode and a second gate electrode are arranged in a same layer and simultaneously formed through a same patterning process, a first active layer and a second active layer are arranged in a same layer and formed simultaneously through a same patterning process, and a first source electrode and a first drain electrode are disposed in a same layer as a second source electrode and a second drain electrode, and are simultaneously formed through a same patterning process.

In an exemplary implementation mode, the first shield layer 31 and the second shield layer 41 are disposed in a same layer and simultaneously formed through a same patterning process.

In an exemplary implementation mode, the first transistor 110 and the second transistor 210 may include oxide transistors.

In an exemplary implementation mode, the anode 81 of the emitting structure layer 102 and the electrode lead 91 of the photoelectric structure layer 202 may be disposed in a same layer and formed simultaneously through a same patterning process.

In an exemplary implementation mode, the drive circuit layer 101 further includes a connection electrode 61 connected with the first drain electrode of the first transistor 110 through a via. The anode 81 of the emitting structure layer 102 is connected with the connection electrode 61 through a via, and the connection electrode 61 of the drive circuit layer 101 and the first electrode 71 of the photoelectric structure layer 202 may be arranged in a same layer and formed simultaneously through a same patterning process.

In an exemplary implementation mode, the display substrate may include other film layers, such as a color film layer or an encapsulation layer, which is not limited in the present disclosure.

Exemplary description is made below through a preparation process of a display substrate. A "patterning process"

mentioned in the present disclosure includes coating with a photoresist, mask exposure, development, etching, photoresist stripping, and other treatments for a metal material, an inorganic material, or a transparent conductive material, and includes coating with an organic material, mask exposure, development, and other treatments for an organic material. Deposition may be any one or more of sputtering, evaporation, and chemical vapor deposition. Coating may be any one or more of spray coating, spin coating, and ink-jet printing. Etching may be any one or more of dry etching and wet etching, which is not limited in present disclosure. A "thin film" refers to a layer of thin film made of a material on a base substrate through a process such as deposition and coating. If the "thin film" does not need a patterning process in an entire preparation process, the "thin film" may also be called a "layer". If the "thin film" needs a patterning process in an entire preparation process, it is called a "thin film" before the patterning process, and called a "layer" after the patterning process. The "layer" after the patterning process includes at least one "pattern". "A and B being disposed in a same layer" mentioned in the present disclosure means that A and B are formed simultaneously through a same patterning process, and a "thickness" of a film layer is a dimension of the film layer in a direction perpendicular to a display substrate. In an exemplary embodiment of the present disclosure, "an orthographic projection of B is within a range of an orthographic projection of A" means that a boundary of the orthographic projection of B falls within a range of a boundary of the orthographic projection of A, or the boundary of the orthographic projection of A is overlapped with the boundary of the orthographic projection of B.

FIGS. 5 to 18 are schematic diagrams showing the preparation process of the display substrate. In an exemplary implementation mode, the preparation process of the display substrate may include following operations.

(1) A base substrate is provided. In an exemplary implementation mode, a base substrate 10 may be a rigid base substrate, which may be glass or quartz.

In one possible exemplary implementation mode, the base substrate may be a flexible base substrate which may be of a single-layer structure or a laminated structure. In an exemplary implementation mode, the flexible base substrate may include a first flexible material layer, a first inorganic material layer, a second flexible material layer, and a second inorganic material layer stacked on a glass carrier plate.

Figure 5:
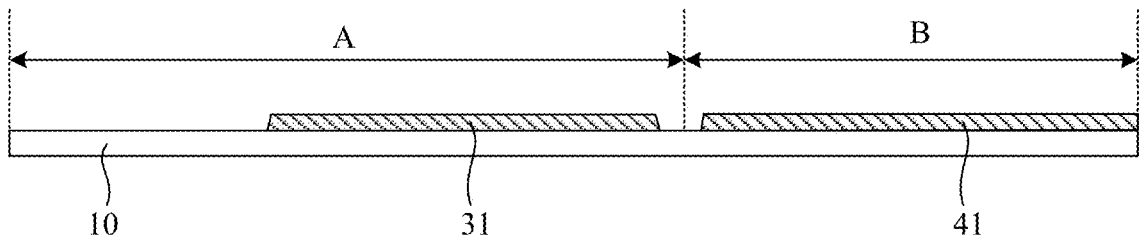
FIG. 5 is a schematic diagram after a pattern of a first metal layer is formed according to an exemplary embodiment of the present disclosure.

(2) A pattern of a first metal layer is formed. In an exemplary implementation mode, forming the pattern of the first metal layer may include: a first metal thin film is deposited on the base substrate 10, and the first metal thin film is patterned through a patterning process to form the pattern of the first metal layer disposed on the base substrate 10. The pattern of the first metal layer at least includes a first shield layer 31 located in a light emitting region A and a second shield layer 41 located in a sensing region B, as shown in FIG. 5.

In an exemplary implementation mode, a thickness of the first shield layer 31 and the second shield layer 41 may be about 1500 Å to 3000 Å.

Figure 6:
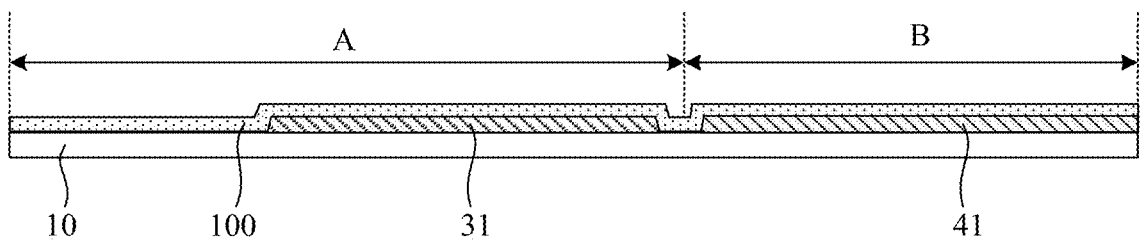
FIG. 6 is a schematic diagram after a pattern of an impurity absorption layer is formed according to an embodiment of the present disclosure.

(3) A pattern of an impurity absorption layer is formed. In an exemplary implementation mode, forming the pattern of the impurity absorption layer may include: an impurity absorption thin film is deposited on the base substrate on which the aforementioned pattern is formed, a plasma treatment is performed on the impurity absorption thin film to form a pattern of an impurity absorption layer 100 covering the first metal layer, that is, covering the first shield layer 31 and the second shield layer 41, as shown in FIG. 6.

In an exemplary implementation mode, a thickness of the impurity absorption layer 100 may be about 200 Å to 1000 Å. For example, the thickness of the impurity absorption layer 100 may be about 500 Å.

In an exemplary implementation mode, by strictly controlling process parameters of depositing the impurity absorption thin film, the deposited impurity absorption thin film has a stricter atomic ratio of a silicon element to a nitrogen element, so as to achieve that the impurity absorption layer effectively reduces penetration of hydrogen elements, oxygen elements, and metal elements into an active layer of a transistor.

In an exemplary implementation mode, strictly controlled process parameters may include a deposition power, a deposition temperature, and a deposition pressure.

In an exemplary implementation mode, depositing the impurity absorption thin film may include: depositing silicon nitride, silicon oxynitride, aluminum silicon nitride, or a mixture of silicon nitride and silicon oxynitride in a Chemical Vapor Deposition (CVD) manner under a deposition power of 500 W to 1200 W, a deposition temperature of 330° C. to 450° C., and a deposition pressure of 1000 millitorr (mT) to 1800 mT, and controlling an atomic ratio of a silicon element to a nitrogen element in the impurity absorption layer to be about 1:5 to 1:35.

In an exemplary implementation mode, by strictly controlling process parameters of the plasma treatment, the formed impurity absorption layer and a buffer layer formed subsequently may have strong adhesion, so that the impurity absorption layer and the buffer layer constitute a buffer+cut-off structure.

In an exemplary implementation mode, strictly controlled process parameters may include a plasma power, a plasma pressure, and a plasma gas.

In an exemplary implementation mode, performing a plasma treatment on the impurity absorption thin film may include: performing a plasma treatment on the impurity absorption thin film using nitrous oxide ($N_2O$) under a plasma power of 600 W to 1500 W and a plasma pressure of 600 mT to 2000 mT.

In an exemplary implementation mode, the atomic ratio of the silicon element to the nitrogen element in the impurity absorption layer may be about 1:10 to 1:25. For example, the atomic ratio of the silicon element to the nitrogen element in the impurity absorption layer 100 may be about 1:17.

Figure 7:
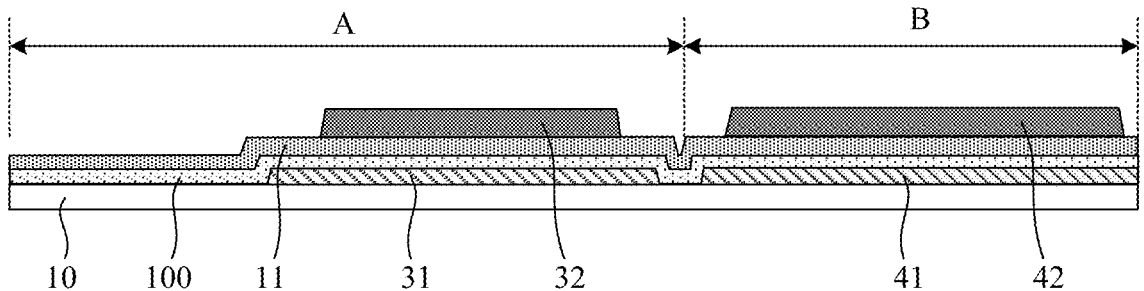
FIG. 7 is a schematic diagram after patterns of a first insulation layer and a semiconductor are formed according to an exemplary embodiment of the present disclosure.

(4) Patterns of a first insulation layer and a semiconductor layer are formed. In an exemplary implementation mode, forming the patterns of the first insulation layer and the semiconductor layer may include: a first insulation thin film and a semiconductor thin film are deposited in sequence on the base substrate on which the aforementioned patterns are formed, the semiconductor thin film is patterned through a patterning process to form a pattern of a first insulation layer 11 covering the impurity absorption layer 100, and a pattern of a semiconductor layer disposed on the first insulation layer 11. The pattern of the semiconductor layer at least includes a first active layer 32 located in the light emitting region A and a second active layer 42 located in the sensing region B, as shown in FIG. 7.

In an exemplary implementation mode, a thickness of the first insulation layer 11 may be about 2700 Å to 3800 Å. For example, the thickness of the first insulation layer 11 may be about 3200 Å.

In an exemplary implementation mode, a material of the first insulation layer 11 may be a Silicon Oxide (SiOx) and the first insulation layer may be referred to as a buffer layer.

In an exemplary implementation mode, the semiconductor thin film may be made of poly silicon or an oxide, which is not limited in the present disclosure. The oxide may be any one or more of Indium Gallium Zinc Oxide (InGaZnO), Indium Gallium Zinc Oxynitride (InGaZnON), Zinc Oxide (ZnO), Zinc Oxynitride (ZnON), Zinc Tin Oxide (ZnSnO), Cadmium Tin Oxide (CdSnO), Gallium Tin Oxide (GaSnO), Titanium Tin Oxide (TiSnO), Copper Aluminum Oxide (CuAlO), Strontium Copper Oxide (SrCuO), Lanthanum Copper Oxysulfide (LaCuOS), Gallium Nitride (GaN), Indium Gallium Nitride (InGaN), Aluminum Gallium Nitride (AlGaN), and Indium Gallium Aluminum Nitride (InGaAlN). In some possible implementation modes, the semiconductor thin film may be made of Indium Gallium Zinc Oxide (IGZO), which has a relatively high electron mobility.

In an exemplary implementation mode, a position of the first active layer 32 corresponds to a position of the first shield layer 31, and an orthographic projection of the first active layer 32 on the base substrate is within a range of an orthographic projection of the first shield layer 31 on the base substrate. A position of the second active layer 42 corresponds to a position of the second shield layer 41, and an orthographic projection of the second active layer 42 on the base substrate is within a range of an orthographic projection of the second shield layer 41 on the base substrate.

In an exemplary implementation mode, a same patterning process may be adopted for forming the impurity absorption layer, and the first insulation layer, and the semiconductor layer. For example, an impurity absorption thin film is deposited first, then a plasma treatment is performed on the impurity absorption thin film, then a first insulation thin film and a semiconductor thin film are sequentially deposited, and then a semiconductor layer is patterned.

Figure 8:
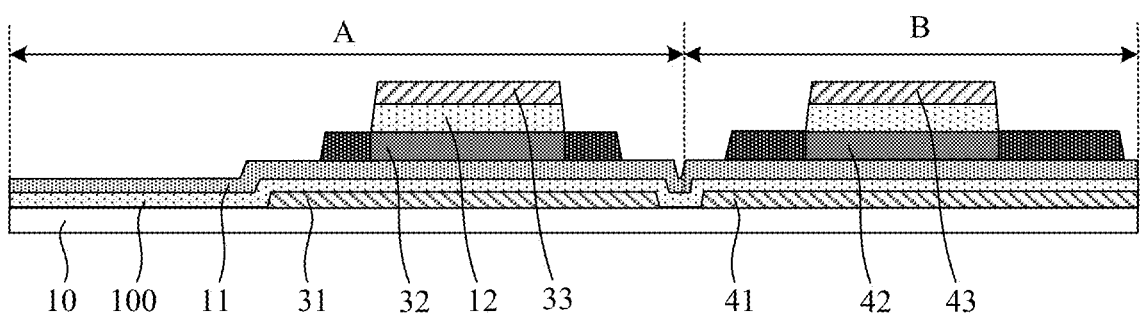
FIG. 8 is a schematic diagram after a pattern of a second metal layer is formed according to an exemplary embodiment of the present disclosure.

(5) A pattern of a second metal layer is formed. In an exemplary implementation mode, forming the pattern of the second metal layer may include: a second insulation thin film and a second metal thin film are sequentially deposited on the base substrate on which the aforementioned patterns are formed, and the second insulation thin film and the second metal thin film are patterned through a patterning process to form a pattern of a second insulation layer 12 disposed on the semiconductor layer, and the pattern of the second metal layer disposed on the second insulation layer 12. The pattern of the second metal layer at least includes a first gate electrode 33 located in the light emitting region A and a second gate electrode 43 located in the sensing region B, as shown in FIG. 8.

In an exemplary implementation mode, the pattern of the second metal layer may include a first capacitor electrode constituting a storage capacitor, the first capacitor electrode may be located in the light emitting region A, and the first capacitor electrode may be disposed on the first insulation layer.

In an exemplary implementation mode, during an etching process of patterning the second metal layer and the second insulation layer, a semiconductor layer not covered by the second metal layer and the second insulation layer is conductive to form a conductive source electrode region and a conductive drain electrode region, the source electrode region and the drain electrode region are configured to be connected a source electrode and a drain electrode formed subsequently.

In an exemplary implementation mode, patterns of the second metal layer and the second insulation layer may be substantially the same, and an orthographic projection of the second metal layer on the base substrate is within a range of an orthographic projection of the second insulation layer on the base substrate.

In an exemplary implementation mode, the second insulation layer may be referred to as a Gate Insulator (GI) layer and the second metal layer may be referred to as a gate metal (GATE) layer.

Figure 9:
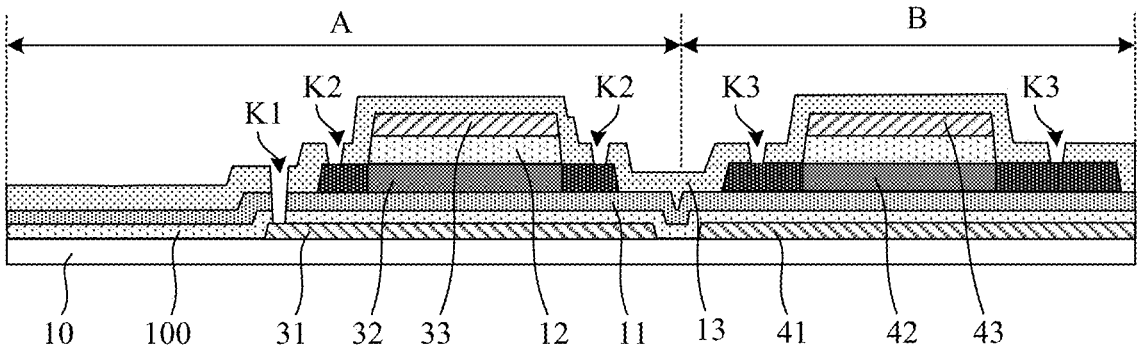
FIG. 9 is a schematic diagram after a pattern of a third insulation layer is formed according to an exemplary embodiment of the present disclosure.

(6) A pattern of a third insulation layer is formed. In an exemplary implementation mode, forming the pattern of the third insulation layer may include: a third insulation thin film is deposited on the base substrate on which the aforementioned patterns are formed, the third insulation thin film is patterned through a patterning process to form a pattern of a third insulation layer 13 covering the pattern of the second metal layer. The third insulation layer 13 of the light emitting region A is provided with a first via K1 and a second via K2. The third insulation layer 13, the first insulation layer 11, and the impurity absorption layer 100 in the first via K1 are etched away to expose a surface of the first shield layer 31. The third insulation layer 13 in the second via K2 is etched away to expose a surface of the first active layer 32. A third via K3 is provided on the third insulation layer 13 of the sensing region B, and the third insulation layer 13 in the third via K3 is etched away to expose a surface of the second active layer 42, as shown in FIG. 9.

In an exemplary implementation mode, in a process of patterning the third insulation layer, the second via K2 exposes the conductive source electrode region and the conductive drain electrode region in the first active layer 32, respectively, and the third via K3 exposes the conductive source electrode region and the conductive drain electrode region in the second active layer 42, respectively.

In an exemplary implementation mode, the third insulation layer may be referred to as an Interlayer Dielectric (ILD) layer.

Figure 10:
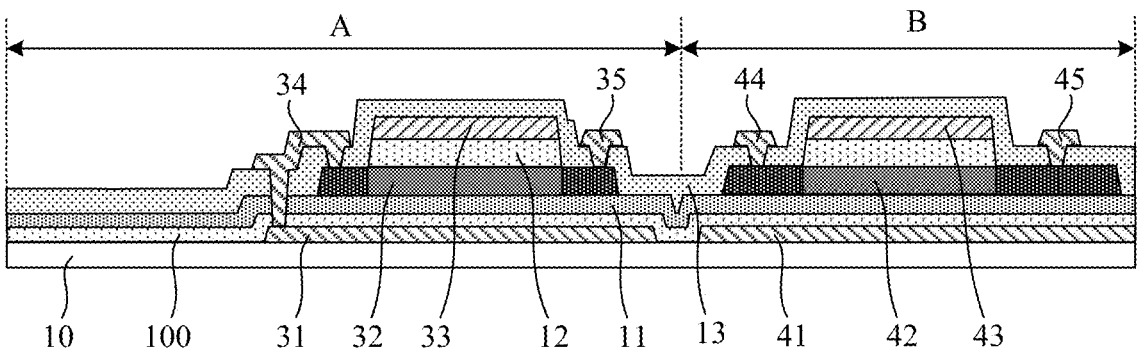
FIG. 10 is a schematic diagram after a pattern of a third metal layer is formed according to an exemplary embodiment of the present disclosure.

(7) A pattern of a third metal layer is formed. In an exemplary implementation mode, forming the pattern of the third metal layer may include: a third metal thin film is deposited on the base substrate on which the aforementioned patterns are formed; the third metal thin film is patterned through a patterning process to form the pattern of the third metal layer. The pattern of the third metal layer at least includes a first source electrode 34 and a first drain electrode 35 located in the light emitting region A, and a second source electrode 44 and a second drain electrode 45 located in the sensing region B. The first source electrode 34 and the first drain electrode 35 are respectively connected with the first active layer 32 through a second via K2, the first source electrode 34 is simultaneously connected with the first shield layer 31 through a first via K1, and the second source electrode 44 and the second drain electrode 45 are respectively connected with the second active layer 42 through a third via K3, as shown in FIG. 10.

In an exemplary implementation mode, the pattern of the third metal layer may include a second capacitor electrode constituting a storage capacitor, and a position of the second capacitor electrode corresponds to a position of the first capacitor electrode.

In an exemplary implementation mode, the third metal layer may be referred to as a first source drain metal (SD1) layer.

Figure 11:
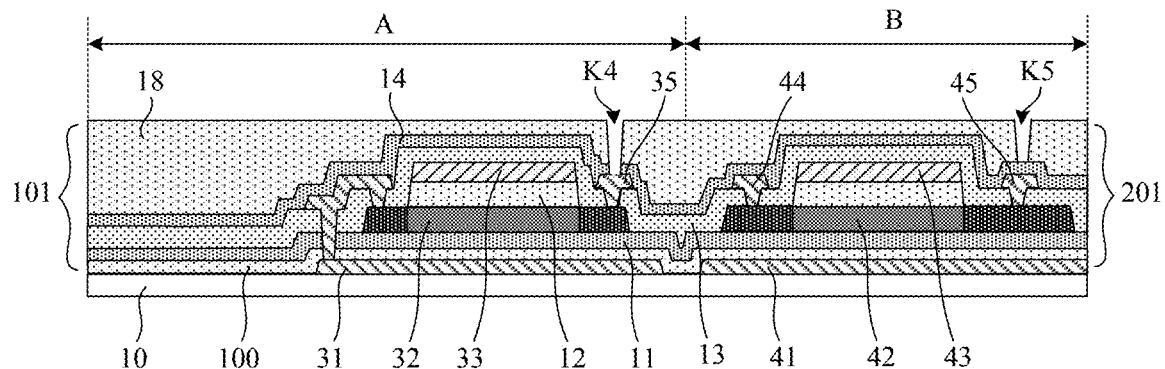
FIG. 11 is a schematic diagram after a pattern of a first planarization layer is formed according to an exemplary embodiment of the present disclosure.

(8) Patterns of a fourth insulation layer and a first planarization layer are formed. In an exemplary implementation mode, forming patterns of the fourth insulation layer and the first planarization layer may include: a fourth insulation thin film is deposited on the base substrate on which the aforementioned patterns are formed first, a planarization thin film is then coated on the fourth insulation thin film, the thin film is patterned through a patterning process to form a pattern of a fourth insulation layer 14 covering the third metal layer and a pattern of a first planarization layer 18 covering the fourth insulation layer 14. The light emitting region A is formed with a fourth via K4, the first planarization layer 18 and the fourth insulation layer 14 in the fourth via K4 are removed to expose a surface of the first drain electrode 35. The sensing region B is formed with a fifth via K5, the first planarization layer 18 and the fourth insulation layer 14 in the fifth via K5 are removed to expose a surface of the second drain electrode 45, as shown in FIG. 11.

In an exemplary implementation mode, the fourth insulation layer may be referred to as a first Passivation (PVX1) layer.

So far, a drive circuit layer 101 and a sensing circuit layer 201 are formed on the base substrate. The drive circuit layer 101 may include a first shield layer 31, an impurity absorption layer 100, and a first transistor 110. The first transistor 110 with a top gate structure may include a first active layer 32, a first gate electrode 33, a first source electrode 34, and a first drain electrode 35. The first source electrode 34 is connected with the first shield layer 31 through a first via to form a double gate structure. The sensing circuit layer 201 may include a second shield layer 41, an impurity absorption layer 100, and a second transistor 210, and the second transistor 210 with a top gate structure may include a second active layer 42, a second gate electrode 43, a second source electrode 44, and a second drain electrode 45.

Figure 12:
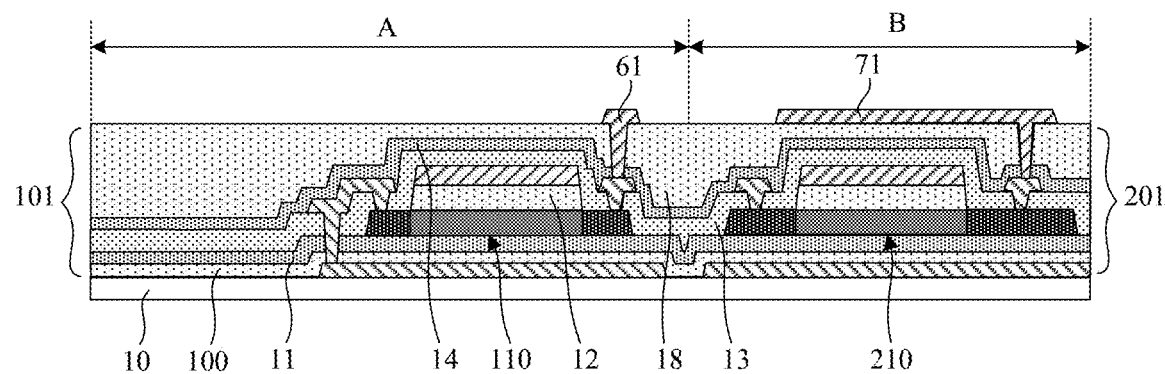
FIG. 12 is a schematic diagram after a pattern of a fourth metal layer is formed according to an exemplary embodiment of the present disclosure.

(9) A pattern of a fourth metal layer is formed. In an exemplary implementation mode, forming the pattern of the fourth metal layer may include: a fourth metal thin film is deposited on the base substrate on which the aforementioned patterns are formed, the fourth metal thin film is patterned through a patterning process to form the pattern of the fourth metal layer. The pattern of the fourth metal layer at least includes a connection electrode 61 located in the light emitting region A, and a first electrode 71 located in the sensing region B. The connection electrode 61 is connected with a first drain electrode of the first transistor 110 through a fourth via K4, and the first electrode 71 is connected with the second drain electrode of the second transistor 210 through a fifth via K5, as shown in FIG. 12.

In an exemplary implementation mode, the fourth metal layer may be referred to as a second source drain metal (SD2) layer.

Figure 13:
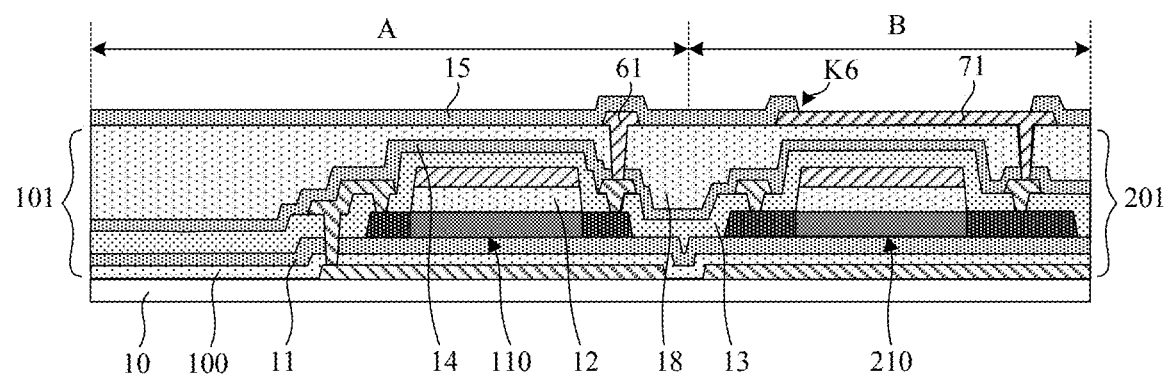
FIG. 13 is a schematic diagram after a pattern of a fifth insulation layer is formed according to an exemplary embodiment of the present disclosure.

(10) A pattern of a fifth insulation layer is formed. In an exemplary implementation mode, forming the pattern of the fifth insulation layer may include: a fifth insulation thin film is deposited on the base substrate on which the aforementioned patterns are formed, and the fifth insulation thin film is patterned through a patterning process to form a pattern of a fifth insulation layer 15 covering the fourth metal layer. A sixth via K6 is formed on the fifth insulation layer 15 of the sensing region B, and the fifth insulation layer 15 in the sixth via K6 is etched away to expose a surface of the first electrode 71, as shown in FIG. 13.

In an exemplary implementation mode, the fifth insulation layer may be referred to as a second Passivation (PVX2) layer.

Figure 14:
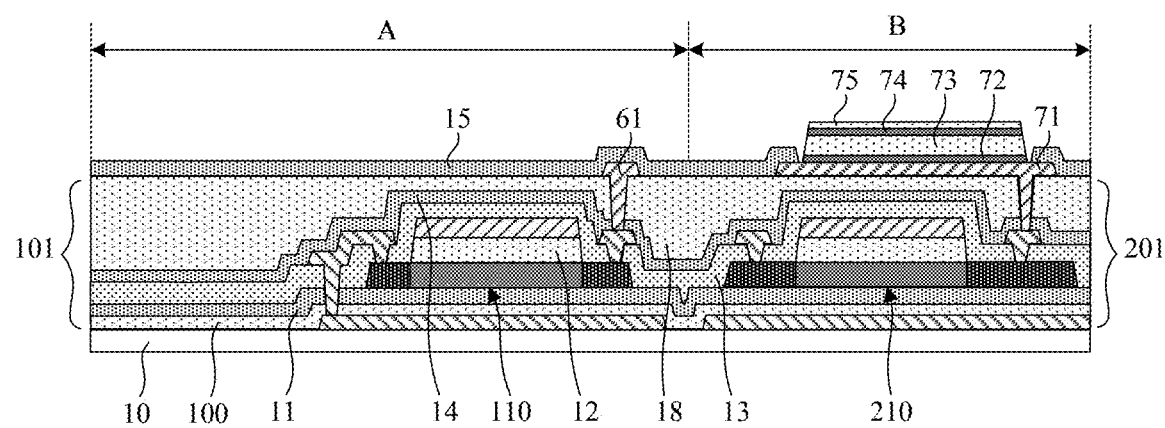
FIG. 14 is a schematic diagram after a pattern of a photodiode is formed according to an exemplary embodiment of the present disclosure.

(11) A pattern of a photodiode is formed. In an exemplary implementation mode, forming the pattern of the photodiode may include: a first doped thin film, an intrinsic thin film, a second doped thin film, and a first conductive thin film are sequentially deposited on the base substrate on which the aforementioned patterns are formed. The first doped thin film, the intrinsic thin film, the second doped thin film, and the first conductive thin film are patterned through a patterning process to form a first doped layer 72, an intrinsic layer 73, a second doped layer 74, and a second electrode 75 that are stacked on the first electrode 71 in the sixth via K6. The first doped layer 72 is disposed on a side of the first electrode 71 away from the base substrate, the intrinsic layer 73 is disposed on a side of the first doped layer 72 away from the base substrate, the second doped layer 74 is disposed on a side of the intrinsic layer 73 away from the base substrate, and the second electrode 75 is disposed on a side of the second doped layer 74 away from the base substrate, as shown in FIG. 14.

In an exemplary implementation mode, materials of the first doped thin film and the second doped thin film may be silicon-based semiconductors such as amorphous silicon, microcrystalline silicon, or a silicon-germanium alloy, which are performed through a doping process after deposition to form doped thin films. In an exemplary implementation mode, for the doping process, N-type ion implantation or P-type ion implantation may be adopted to form an N-type doped layer or a P-type doped layer. A material of the intrinsic thin film may be silicon-based semiconductors such as amorphous silicon, microcrystalline silicon, or a silicon germanium alloy, and a material of the conductive thin film may be a metal oxide transparent conductive material with a high work function, such as Indium Tin Oxide (ITO) or Indium Zinc Oxide (IZO).

In an exemplary implementation mode, the first doped layer 72 may be a P-type doped layer, the second doped layer 74 may be an N-type doped layer, or the first doped layer 72 may be an N-type doped layer, and the second doped layer 74 may be a P-type doped layer.

So far, a PIN photodiode as a photosensitive device is formed. The photodiode includes a first electrode 71, a first doped layer 72, an intrinsic layer 73, a second doped layer 74, and a second electrode 75 disposed sequentially along a direction perpendicular to the base substrate. The first electrode 71 is connected with the second drain electrode of the second transistor 210 through a via. In an exemplary embodiment, a thickness of the photodiode may be about 0.8 μm to 1.2 μm. For example, the thickness of the photodiode may be about 1 μm.

Figure 15:
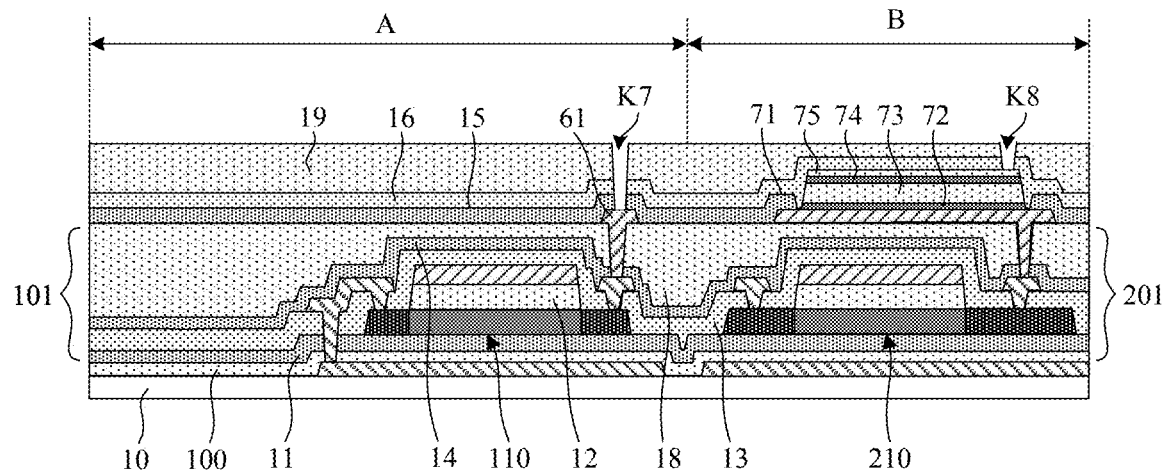
FIG. 15 is a schematic diagram after a pattern of a second planarization layer is formed according to an exemplary embodiment of the present disclosure.

(12) Patterns of a sixth insulation layer and a second planarization layer are formed. In an exemplary implementation mode, forming the patterns of the sixth insulation layer and the second planarization layer may include: first, a sixth insulation thin film is deposited on the base substrate on which the aforementioned patterns are formed, a planarization thin film is then coated on the sixth insulation thin film, the thin film is patterned through a patterning process to form a pattern of a sixth insulation layer 16 covering the PIN photodiode and a pattern of a second planarization layer 19 covering the sixth insulation layer 16. The light emitting region A is formed with a seventh via K7, the sensing region B is formed with an eighth via K8. The second planarization layer 19, the sixth insulation layer 16, and the fifth insulation layer 15 in the seventh via K7 are removed to expose a surface of the connection electrode 61, and the second planarization layer 19 and the sixth insulation layer 16 in the eighth via K8 are removed to expose a surface of the second electrode 75, as shown in FIG. 15.

In an exemplary implementation mode, the sixth insulation layer may be referred to as a third Passivation (PVX3) layer.

Figure 16:
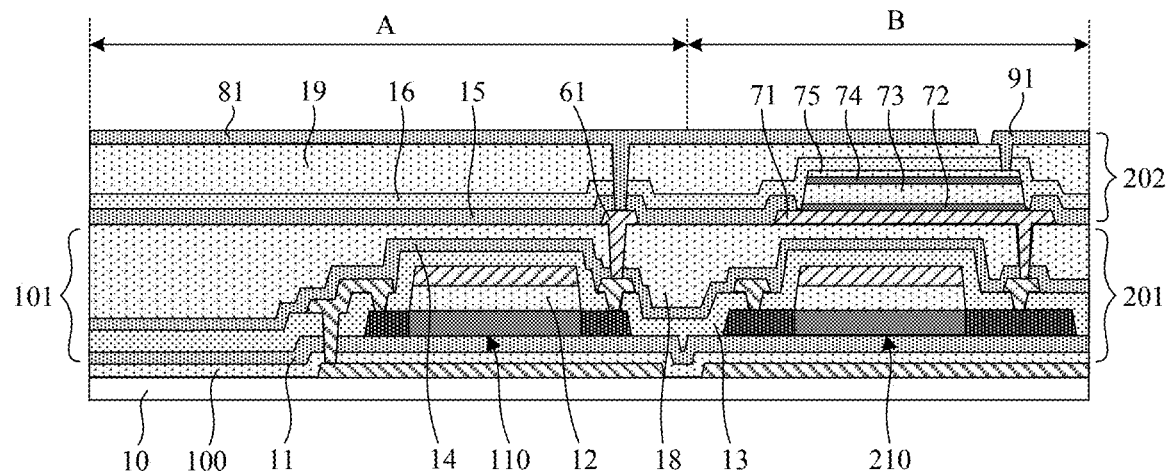
FIG. 16 is a schematic diagram after a pattern of a second conductive layer is formed according to an exemplary embodiment of the present disclosure.

(13) A pattern of a second conductive layer is formed. In an exemplary implementation mode, forming the pattern of the second conductive layer may include: a second conductive thin film is deposited on the base substrate on which the aforementioned patterns are formed; the second conductive thin film is patterned through a patterning process to form the pattern of the second conductive layer. The pattern of the second conductive layer at least includes an anode 81 and an electrode lead 91 arranged in isolation, the anode 81 may be located in the light emitting region A and the sensing region B, and the electrode lead 91 may be located in the sensing region B. The anode 81 is connected with the connection electrode 61 through the seventh via K7, and the electrode lead 91 is connected with the second electrode 75 through the eighth via K8, as shown in FIG. 16.

In an exemplary implementation mode, the second conductive layer may be a single-layer transparent conductive thin film, such as Indium Tin Oxide (ITO) or Indium Zinc Oxide (IZO), or may be a multi-layer composite structure, such as ITO/Al/ITO.

So far, a photoelectric structure layer 202 is prepared. The photoelectric structure layer 202 may include an electrode lead 91 and a PIN photodiode, the photodiode includes a first electrode 71, a first doped layer 72, an intrinsic layer 73, a second doped layer 74, and a second electrode 75 disposed sequentially along a direction perpendicular to the base substrate. The first electrode 71 is connected with the second drain electrode of the second transistor 210 through a via, and the second electrode 75 is connected with the electrode lead 91 through a via.

Figure 17:
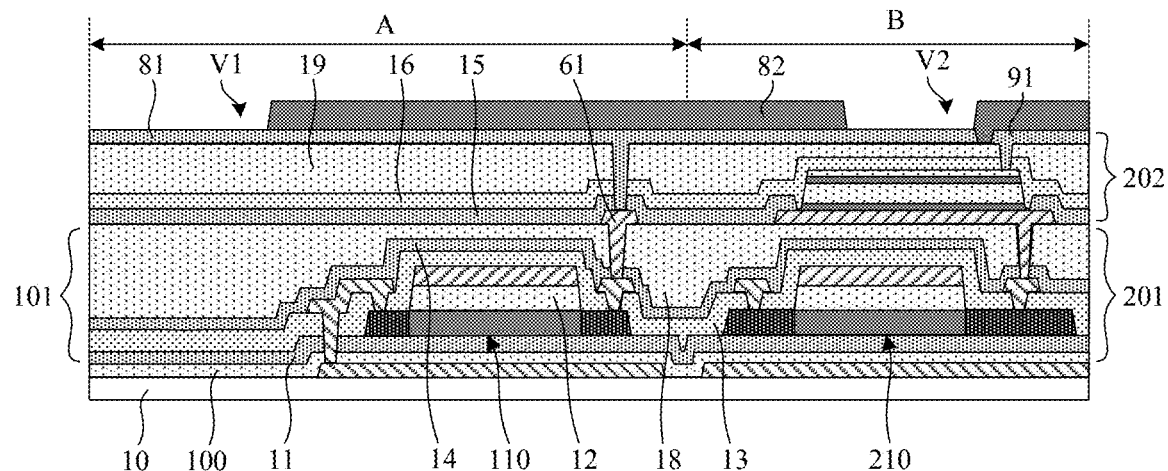
FIG. 17 is a schematic diagram after a pattern of a pixel definition layer is formed according to an exemplary embodiment of the present disclosure.

(14) A pattern of a pixel definition layer is formed. In an exemplary implementation mode, forming the pattern of the pixel definition layer may include: a pixel definition thin film is coated on the base substrate on which the aforementioned patterns are formed; the pixel definition thin film is patterned through a patterning process to form a pattern of a Pixel Definition Layer (PDL) 82 covering the pattern of the second conductive layer. A first pixel opening V1 and a second pixel opening V2 are formed on the pixel definition layer 82. The first pixel opening V1 is located in the light emitting region A, the second pixel opening V2 is located in the sensing region B. The pixel definition layer in the first pixel opening V1 and the second pixel opening V2 is removed to expose a surface of the anode 81, as shown in FIG. 17.

In an exemplary implementation mode, the pixel definition layer may be made of Polyimide (PI), acrylic, Polyethylene Terephthalate (PET), or the like. In a plane parallel to the display substrate, the first pixel opening and the second pixel opening may be in a shape of a triangle, a rectangle, a polygon, a circle, an ellipse, or the like. In a plane perpendicular to the display substrate, sectional shapes of the first pixel opening and the second pixel opening may be a rectangle, a trapezoid, or the like.

In an exemplary implementation mode, a Post Spacer (PS) may be formed simultaneously when forming the pattern of the pixel definition layer, and the pixel definition layer and the post spacer may be formed through a single patterning process using a gray-tone mask.

Figure 18:
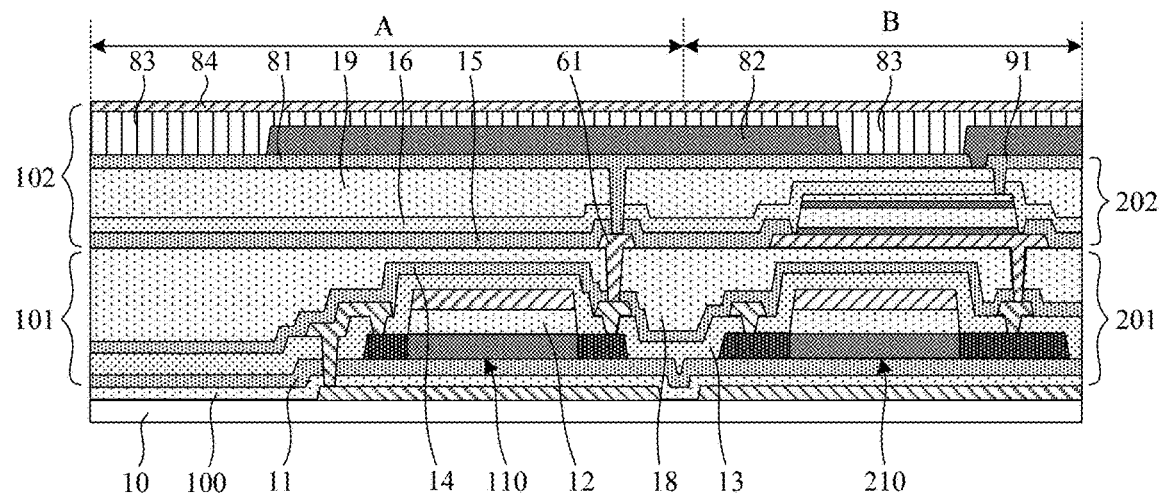
FIG. 18 is a schematic diagram after patterns of an organic emitting layer and a cathode are formed according to an exemplary embodiment of the present disclosure.

(15) Patterns of an organic emitting layer and a cathode are formed. In an exemplary implementation mode, forming the patterns of the organic emitting layer and the cathode may include: on the base substrate on which the aforementioned patterns are formed, a pattern of an organic emitting layer 83 is formed by means of vapor deposition or ink-jet printing. The organic emitting layer 83 in each sub-pixel is connected with the anode 81 through the first pixel opening V1 of the light emitting region A and the second pixel opening V2 of the sensing region B. Subsequently a pattern of a cathode 84 is formed by means of evaporation, the cathode 84 may be of a monolithic structure communicated together and connected with the organic emitting layer 83 in each sub-pixel, as shown in FIG. 18.

In an exemplary implementation mode, the organic emitting layer may include an Emitting Layer (EML) and any one or more of following: a Hole Injection Layer (HIL), a Hole Transport Layer (HTL), an Electron Block Layer (EBL), a Hole Block Layer (HBL), an Electron Transport Layer (ETL), and an Electron Injection Layer (EIL).

In an exemplary implementation mode, organic emitting layers of different sub-pixels may emit light of different colors, such as red light, green light, and blue light. An emitting layer of a sub-pixel emitting red light is made of a red light emitting material, an emitting layer of a sub-pixel emitting green light is made of a green light emitting material, and an emitting layer of a sub-pixel emitting blue light is made of a blue light emitting material. In an exemplary implementation mode, hole injection layers, hole transport layers, electron block layers, hole block layers, electron transport layers, and electron injection layers of all sub-pixels may be a common layer communicated together. Emitting layers of adjacent sub-pixels may be overlapped slightly, or may be isolated. In an exemplary implementation mode, the organic emitting layer may be formed by means of evaporation using a Fine Metal Mask (FMM) and an open mask, or using an ink-jet process.

So far, preparation of an emitting structure layer 102 is completed. The emitting structure layer 102 may include an anode 81, a pixel definition layer 82, an organic emitting layer 83, and a cathode 84. The anode 81 is connected with the first drain electrode of the first transistor 110 through the connection electrode 61, and the organic emitting layer 83 in the first pixel opening and the second pixel opening region is disposed between the anode 81 and the cathode 84. In an exemplary implementation mode, light emitted from the organic emitting layer in the first pixel opening region passes through the drive circuit layer and the base substrate, and then is emitted from a side of the base substrate away from the drive circuit layer (bottom emission), thereby achieving image display. Light emitted from the organic emitting layer in the second pixel opening region is incident to a photodiode, and the photodiode senses an intensity of the light, converts a light signal into an electrical signal, and then feeds it back to the pixel drive circuit to achieve corresponding compensation.

In an exemplary implementation mode, after preparation of the emitting structure layer is completed, an encapsulation structure layer may be formed. The encapsulation structure layer may include a first encapsulation layer, a second encapsulation layer, and a third encapsulation layer that are stacked. The first encapsulation layer and the third encapsulation layer may be made of an inorganic material, and the second encapsulation layer may be made of an organic material. The second encapsulation layer is arranged between the first encapsulation layer and the third encapsulation layer to form a laminated structure of inorganic material/organic material/inorganic material, which may ensure that external water vapor cannot enter the emitting structure layer.

In an exemplary implementation mode, the first metal thin film, the second metal thin film, the third metal thin film, and the fourth metal thin film may be made of a metal material, such as any one or more of silver (Ag), copper (Cu), aluminum (Al), titanium (Ti), and molybdenum (Mo), or an alloy material of the above metals, such as an Aluminum Neodymium (AlNd) alloy or a Molybdenum Niobium (MoNb) alloy, and may be of a single-layer structure or a multi-layer composite structure, such as Ti/Al/Ti. The second insulation layer, the third insulation layer, the fourth insulation layer, the fifth insulation layer, and the sixth insulation layer may be made of any one or more of Silicon Oxide (SiOx), Silicon Nitride (SiNx), and Silicon OxyNitride (SiON), and may be a single layer, a multi-layer, or a composite layer. The first planarization layer and the second planarization layer may be made of an organic material, such as a resin, and the present disclosure is not limited herein.

In a structure of an OLED display substrate, a shield layer of a metal material is disposed on a base substrate, a buffer layer covers the shield layer and the base substrate, and an active layer of a transistor is disposed on the buffer layer. When the display substrate is exposed to hydrogen for a long time, a hydrogen element will penetrate into the buffer layer through a circuit layer. Since the buffer layer using silicon oxide has a poor absorption capacity for the hydrogen element, more hydrogen elements will penetrate into the active layer of the transistor. For the active layer using an oxide, penetration of hydrogen elements will make the oxide conductive, which will cause the transistor to be in a state of a high current. Although using silicon nitride or silicon hydroxide for the buffer layer may improve an absorption capacity of the buffer layer for hydrogen elements, however, since the active layer of the transistor is set on the buffer layer, using silicon nitride or silicon hydroxide for the buffer layer will not only lead to a problem of negative bias of the first transistor and the second transistor, which will have a relatively great impact on electrical characteristics of the transistor, but also worsen a contact interface between the active layer and the buffer layer, which will have a relatively great impact on overall performance of the display substrate. In addition, in a high temperature environment of preparing the circuit layer, oxygen elements in the base substrate and metal elements in the shield layer will also penetrate into the active layer of the transistor through the buffer layer, which will affect the electrical characteristics of the transistor.

As may be seen from the structure and the preparation process of the display substrate of the exemplary embodiment of the present disclosure, according to the exemplary embodiment of the present disclosure, penetration of hydrogen elements, oxygen elements, and metal elements into the active layer of the transistor may be effectively reduced by providing the impurity absorption layer disposed between the metal layer and the buffer layer. When the display substrate is exposed to hydrogen atmosphere and a hydrogen element permeates through the circuit layer and buffer layer to the impurity absorption layer, since a nitrogen silicon compound is adopted for the impurity absorption layer of the present disclosure and an atomic ratio of a silicon element to a nitrogen element in the impurity absorption layer is strictly controlled by controlling process parameters in a process of forming the impurity absorption layer, the hydrogen element penetrating into the impurity absorption layer and a nitrogen element in the impurity absorption layer form an H=N bond, and the formed H=N bond may effectively reduce hydrogen elements penetrating into an oxide active layer, weaken an influence of the hydrogen elements on the oxide active layer, avoid conductivity of the oxide active layer, and avoid the transistor being in a state of a high current. In a high temperature environment of the preparation process, when an oxygen element in the base substrate and a metal element in the shield layer penetrate into the impurity absorption layer, the oxygen element and the metal element (M) form an N=O bond and an N=M bond with a nitrogen element in the impurity absorption layer, respectively. The formed N=O bond and N=M bond may effectively reduce an influence of the oxygen element and the metal element on the oxide active layer, avoid shift of a threshold voltage of the transistor, and ensure electrical performance of the transistor. The display substrate of the exemplary embodiment of the present disclosure may effectively reduce penetration of hydrogen elements, oxygen elements, metal elements, and the like into the active layer of the transistor, effectively ensure electrical stability of the transistor and uniformity of electrical characteristics of the transistor, avoiding a large number of bright spots on the display substrate, and improving a yield and a display effect.

According to the exemplary embodiment of the present disclosure, the first transistor with the double gate structure is formed by providing the first source electrode of the first transistor connected with the first shield layer, i.e. the first transistor may include a lower transistor and an upper transistor of a same channel. Even if a hydrogen element penetrates into the first active layer, since a signal voltage value of a gate electrode (first shield layer) of the lower transistor is smaller than a signal voltage value of a gate electrode (first gate electrode) of the upper transistor, a negative bias degree of a threshold voltage of the lower transistor is smaller than a negative bias degree of a threshold voltage of the upper transistor, thereby reducing an overall negative bias degree of the first transistor, ensuring stability of the first transistor, and ensuring uniformity of electrical characteristics of a transistor.

According to the exemplary embodiment of the present disclosure, the thickness of the photodiode is set to be about 0.8 μm to 1.2 μm. The thickness of the impurity absorption layer is about 200 Å to 1000 Å, which may make a diffusion amount of hydrogen elements in a process of preparing the photodiodes be absorbed by the impurity absorption layer, effectively ensure an absorption efficiency of the impurity absorption layer, minimize penetration of hydrogen elements into an active layer, and ensure normal electrical characteristics of a transistor.

According to the exemplary embodiment of the present disclosure, the thickness of the first shield layer and the second shield layer is set to be about 1500 Å to 3000 Å, and the thickness of the impurity absorption layer with the is 200 Å to 1000 Å, which may make a diffusion amount of metal elements be absorbed by the impurity absorption layer, effectively ensure an absorption efficiency of the impurity absorption layer, minimize penetration of hydrogen elements into an active layer, and ensure normal electrical characteristics of a transistor.

The preparation process of the display substrate according to the exemplary embodiment of the present disclosure has simple processes and good process compatibility, which helps to ensuring display uniformity and reducing a production cost.

Figure 19:
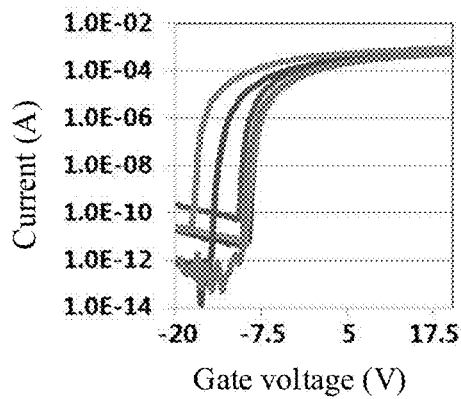
FIG. 19 is a diagram of electrical characteristics of a transistor in a display substrate.
Figure 20:
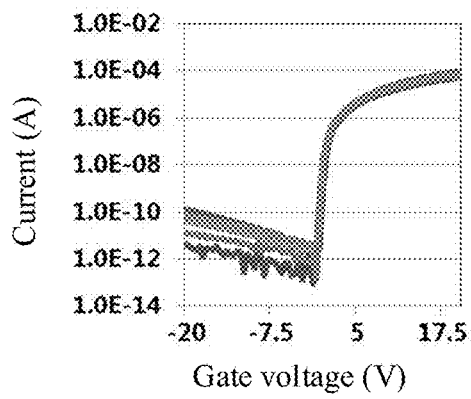
FIG. 20 is a diagram of electrical characteristics of a transistor in a display substrate according to an exemplary embodiment of the present disclosure.

FIG. 19 is a diagram of electrical characteristics of a transistor in a display substrate, and FIG. 20 is a diagram of electrical characteristics of a transistor in a display substrate according to an exemplary embodiment of the present disclosure, illustrating electrical characteristics of transistors at multiple positions on the display substrate, each of the transistors at multiple positions has a width to length ratio (W/L) of 15/6 and a data voltage Vd of 15.1 V. FIG. 19 is a test result of a display substrate without an impurity absorption layer, and FIG. 20 is a test result of a display substrate provided with an impurity absorption layer in which an atomic ratio of a silicon element to a nitrogen element is 1:17. Comparing FIG. 19 to FIG. 20, it may be seen that for the display substrate of the exemplary embodiment of the present disclosure, stability of a transistor and uniformity of electrical characteristics of the transistor are effectively ensured by providing an impurity absorption layer, compared with the display substrate without an impurity absorption layer.

Figure 21:
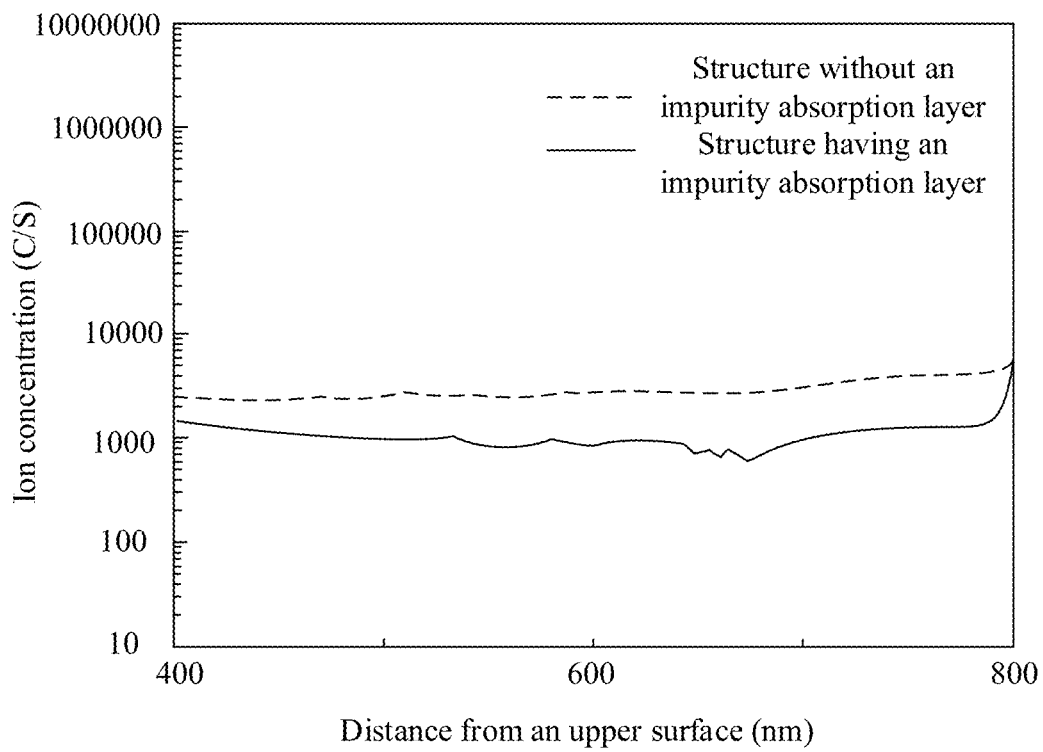
FIG. 21 is a diagram showing a test result of hydrogen element content in an active layer.
Figure 22:
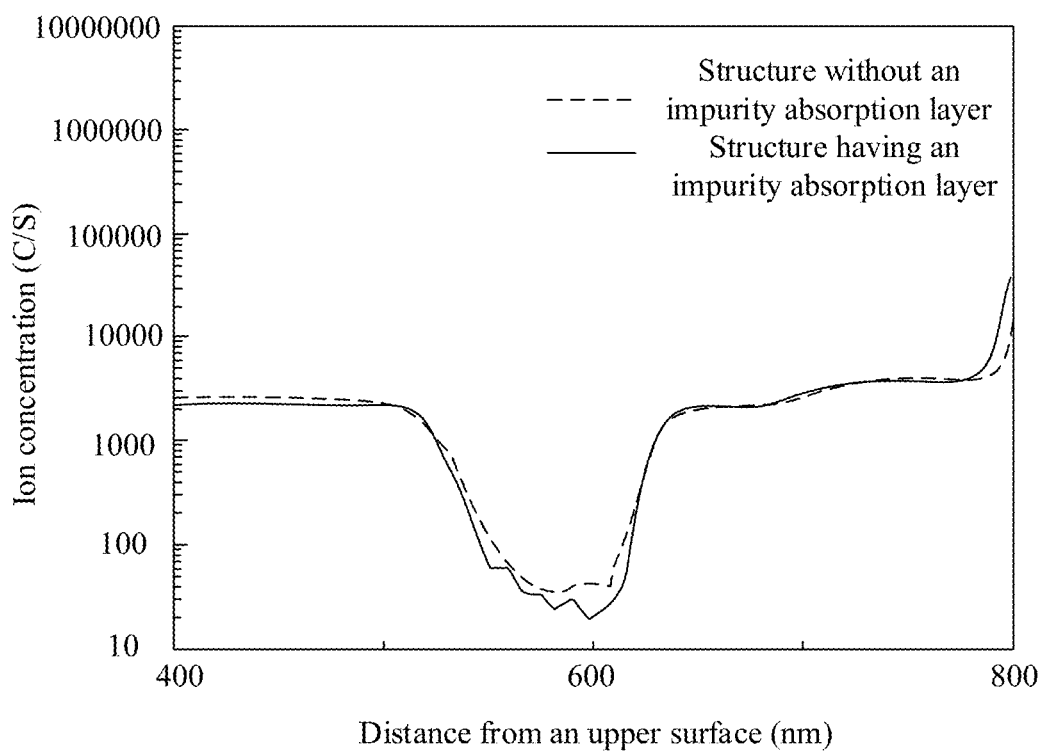
FIG. 22 is a diagram showing a test result of silicon element content in an active layer.

FIG. 21 is a diagram showing a test result of hydrogen element content in an active layer, and FIG. 22 is a diagram showing a test result of silicon element content in an active layer. In the figure, a dashed line is a test result without an impurity absorption layer, and a solid line is a test result of the display substrate provided with an impurity absorption layer. In the provided impurity absorption layer, an atomic ratio of a silicon element to a nitrogen element is 1:17. After the impurity absorption layer absorbs a hydrogen element, an atomic ratio of a silicon element to a hydrogen element in the impurity absorption layer is about 1:13. As shown in FIGS. 21 and 22, compared with a structure without an impurity absorption layer, according to the exemplary embodiment of the present disclosure, by providing an impurity absorption layer, the impurity absorption layer effectively reduces penetration of hydrogen elements into an active layer and effectively reduces hydrogen contents in the active layer, the silicon element content in the active layer is does not change significantly, avoiding conductivity of an oxide active layer, and ensures stability of a transistor.

Figure 23:
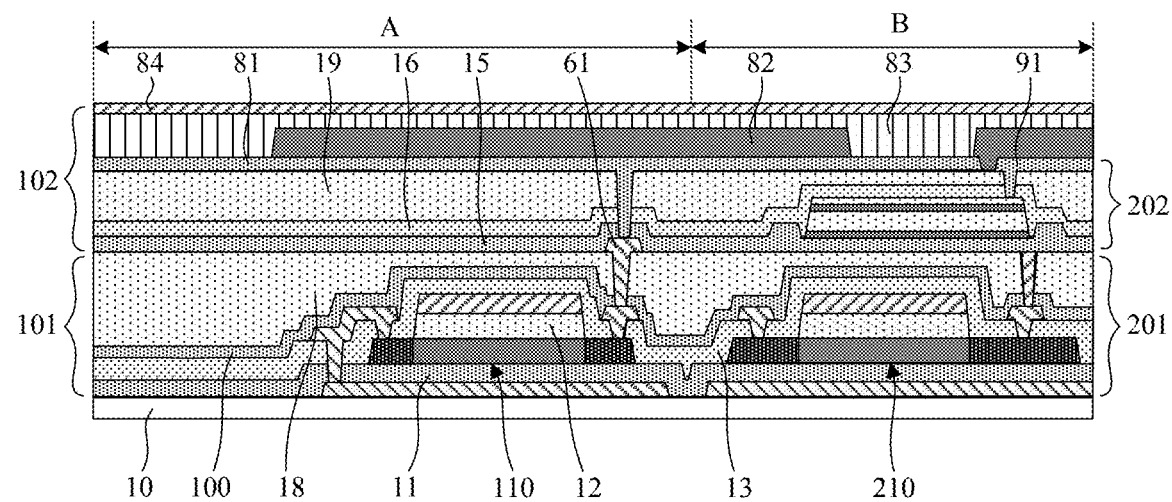
FIG. 23 is a schematic diagram of a sectional structure of another display substrate according to an exemplary embodiment of the present disclosure.

FIG. 23 is a schematic diagram of a sectional structure of another display substrate according to an exemplary embodiment of the present disclosure. As shown in FIG. 23, a main body structure of the display substrate of this exemplary embodiment is similar to that of the aforementioned embodiments, and may include a drive circuit layer 101 and an emitting structure layer 102 disposed in a light emitting region A, and a sensing circuit layer 201 and a photoelectric structure layer 202 disposed in a sensing region B. The drive circuit layer 101 and the sensing circuit layer 201 include transistors and an impurity absorption layer 100, wherein an atomic ratio of a silicon element to a nitrogen element in the impurity absorption layer 100 is 1:5 to 1:35. The impurity absorption layer is configured to reduce penetration of hydrogen elements into the transistors in the drive circuit layer 101 and the sensing circuit layer 201, so as to ensure normal electrical characteristics of the transistors, thereby avoiding a large number of bright spots on the display substrate and improving a yield. Different from the aforementioned embodiments, the impurity absorption layer 100 of this exemplary embodiment is located on a side of an active layer of a transistor away from a base substrate, and at least a third insulation layer is provided between the impurity absorption layer 100 and the active layer of the transistor.

In an exemplary implementation mode, the drive circuit layer 101 of the light emitting region A may include: a first shield layer disposed on the base substrate, a first insulation layer 11 covering the first shield layer, a first active layer disposed on a side of the first insulation layer 11 away from the base substrate, a second insulation layer 12 disposed on a side of the first active layer away from the base substrate, a first gate electrode disposed on a side of the second insulation layer 12 away from the base substrate, a third insulation layer 13 covering the first gate electrode, a first source electrode and a first drain electrode disposed on a side of the third insulation layer 13 away from the base substrate, an impurity absorption layer 100 covering the first source electrode and the first drain electrode, and a first planarization layer 18 disposed on a side of the impurity absorption layer 100 away from the base substrate. The first gate electrode, the first active layer, the first source electrode, and the first drain electrode form a first transistor 110. The first source electrode is connected with a first shield layer 31 through a via.

In an exemplary implementation mode, the sensing circuit layer 201 of the sensing region B may include: a second shield layer disposed on the base substrate, a first insulation layer 11 covering the second shield layer, a second active layer disposed on a side of the first insulation layer 11 away from the base substrate, a second insulation layer 12 disposed on a side of the second active layer away from the base substrate, a second gate electrode disposed on a side of the second insulation layer 12 away from the base substrate, a third insulation layer 13 covering the second gate electrode, a second source electrode and a second drain electrode disposed on a side of the third insulation layer 13 away from the base substrate, an impurity absorption layer 100 covering the second source electrode and the second drain electrode, and a first planarization layer 18 disposed on a side of the impurity absorption layer 100 away from the base substrate. The second gate electrode, the second active layer, the second source electrode, and the second drain electrode form a second transistor 210.

In an exemplary implementation mode, structures of the emitting structure layer 102 and the photoelectric structure layer 202 may be the same as those in the aforementioned embodiments.

The preparation process of the display substrate of this exemplary embodiment is similar to that of the aforementioned embodiments, except that patterns of a first insulation layer and a semiconductor layer are directly formed after a pattern of a first metal layer is formed, and after a pattern of a third metal layer is formed, an impurity absorption layer covering the pattern of the third metal layer is formed first, and then a pattern of a first planarization layer is formed. A process of forming the impurity absorption layer is the same as that of the aforementioned embodiments and will not be repeated here.

According to an exemplary embodiment of the present disclosure, penetration of hydrogen elements into an active layer of a transistor may be effectively reduced by providing an impurity absorption layer disposed on a side of the active layer away from the base substrate. When the display substrate is exposed to hydrogen atmosphere and a hydrogen element penetrates into the impurity absorption layer, since a nitrogen silicon compound is adopted for the impurity absorption layer of the present disclosure, and an atomic ratio of a silicon element to a nitrogen element in the impurity absorption layer is strictly controlled by controlling process parameters in a process of forming the impurity absorption layer, the hydrogen element penetrating into the impurity absorption layer and a nitrogen element in the impurity absorption layer form an H=N bond, and the formed H=N bond may effectively reduce a quantity of hydrogen elements penetrating into an oxide active layer, weaken an influence of the hydrogen elements on the oxide active layer, avoid conductivity of the oxide active layer, and avoid a transistor being in a state of a high current. According to the display substrate of the exemplary embodiment of the present disclosure, penetration of hydrogen elements into an active layer of a transistor may be effectively reduced, effectively ensure electrical stability of the transistor and uniformity of electrical characteristics of the transistor, avoiding a large number of bright spots on the display substrate, and improving a yield and a display effect.

According to an exemplary embodiment of the present disclosure, a first transistor with a double gate structure is formed by providing a first source electrode of a first transistor connected with a first shield layer, i.e. the first transistor may include a lower transistor and an upper transistor of a same channel. Even if a hydrogen element penetrates into a first active layer, since a signal voltage value of a gate electrode (first shield layer) of the lower transistor is smaller than a signal voltage value of a gate electrode (first gate electrode) of the upper transistor, a negative bias degree of a threshold voltage of the lower transistor is smaller than a negative bias degree of a threshold voltage of the upper transistor, thereby reducing an overall negative bias degree of the first transistor, ensuring stability of the first transistor and ensuring uniformity of electrical characteristics of a transistor.

Figure 24:
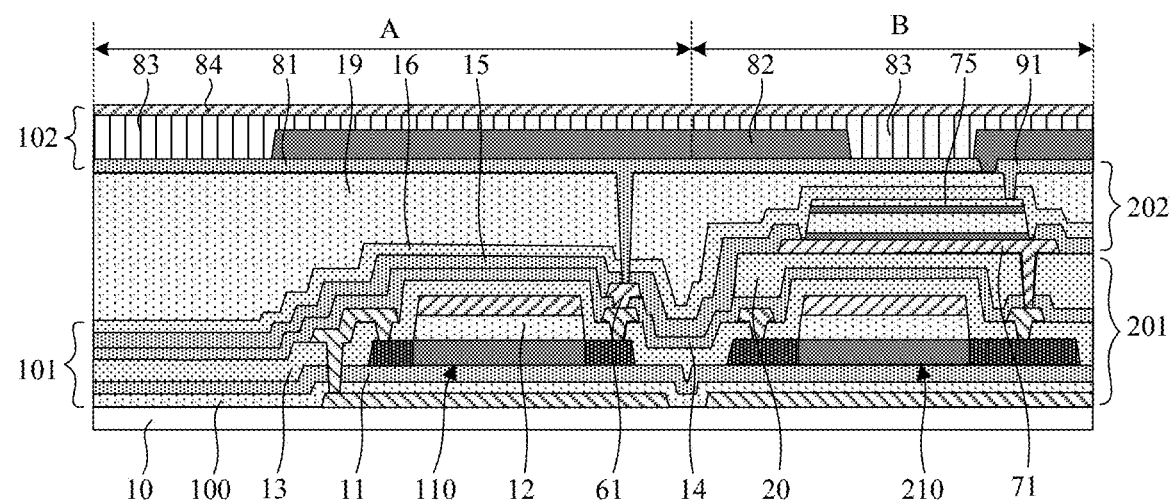
FIG. 24 is a schematic diagram of a sectional structure of yet another display substrate according to an exemplary embodiment of the present disclosure.

FIG. 24 is a schematic diagram of a sectional structure of yet another display substrate according to an exemplary embodiment of the present disclosure. As shown in FIG. 24, a main body structure of the display substrate of this exemplary embodiment is similar to that of the foregoing embodiments, and includes a drive circuit layer 101 and an emitting structure layer 102 disposed in a light emitting region A, and a sensing circuit layer 201 and a photoelectric structure layer 202 disposed in a sensing region B. The drive circuit layer 101 and the sensing circuit layer 201 include transistors and an impurity absorption layer 100, wherein an atomic ratio of a silicon element to a nitrogen element in the impurity absorption layer 100 is 1:5 to 1:35. The impurity absorption layer is configured to reduce penetration of a hydrogen element, an oxygen element, and a metal element into the transistors in the drive circuit layer 101 and the sensing circuit layer 201, so as to ensure normal electrical characteristics of the transistors, thereby avoiding a large number of bright spots on the display substrate and improving a yield. Different from the foregoing embodiments, the sensing region B of this exemplary embodiment is provided with a planarization island 20.

In an exemplary implementation mode, the drive circuit layer 101 of the light emitting region A may include: a first shield layer disposed on the base substrate, an impurity absorption layer 100 covering the first shield layer, a first insulation layer 11 disposed on a side of the impurity absorption layer 100 away from the base substrate, a first active layer disposed on a side of the first insulation layer 11 away from the base substrate, a second insulation layer 12 disposed on a side of the first active layer away from the base substrate, a first gate electrode disposed on a side of the second insulation layer 12 away from the base substrate, a third insulation layer 13 covering the first gate electrode, a first source electrode and a first drain electrode disposed on a side of the third insulation layer 13 away from the base substrate, and a fourth insulation layer 14 covering the first source electrode and the first drain electrode.

In an exemplary implementation mode, the sensing circuit layer 201 of the sensing region B may include: a second shield layer disposed on the base substrate, an impurity absorption layer 100 covering the second shield layer, a first insulation layer 11 disposed on a side of the impurity absorption layer 100 away from the base substrate, a second active layer disposed on a side of the first insulation layer 11 away from the base substrate, a second insulation layer 12 disposed on a side of the second active layer away from the base substrate, a second gate electrode disposed on a side of the second insulation layer 12 away from the base substrate, a third insulation layer 13 covering the second gate electrode, a second source electrode and a second drain electrode disposed on a side of the third insulation layer 13 away from the base substrate, a fourth insulation layer 14 covering the second source electrode and the second drain electrode, and a planarization island 20 disposed on a side of the fourth insulation layer 14 away from the base substrate.

A preparation process of the base substrate of this exemplary embodiment is similar to that of the foregoing embodiments, a difference is that, on the base substrate on which a pattern of a third metal layer is formed, a fourth insulation thin film is deposited first, then an organic material thin film is coated on the fourth insulation thin film, the thin film is patterned through a patterning process using a gray-tone mask to form a pattern of a fourth insulation layer 14 covering the third metal layer and a pattern of a planarization island 20 provided on the fourth insulation layer 14. The light emitting region A is formed with a fourth via, the fourth insulation layer 14 in the fourth via is removed to expose a surface of the first drain electrode. The sensing region B is formed with a fifth via, the planarization island 20 and the fourth insulation layer 14 in the fifth via are removed to expose a surface of the second drain electrode. A pattern of a fourth metal layer is then formed. The pattern of the fourth metal layer at least includes a connection electrode 61 located in the light emitting region A and a first electrode 71 located in the sensing region B. The connection electrode 61 is provided on the fourth insulation layer 14 and connected with the first drain electrode of the first transistor 110 through the fourth via. The first electrode 71 is provided on the planarization island 20 and connected with the second drain electrode of the second transistor 210 through the fifth via.

Figure 25:
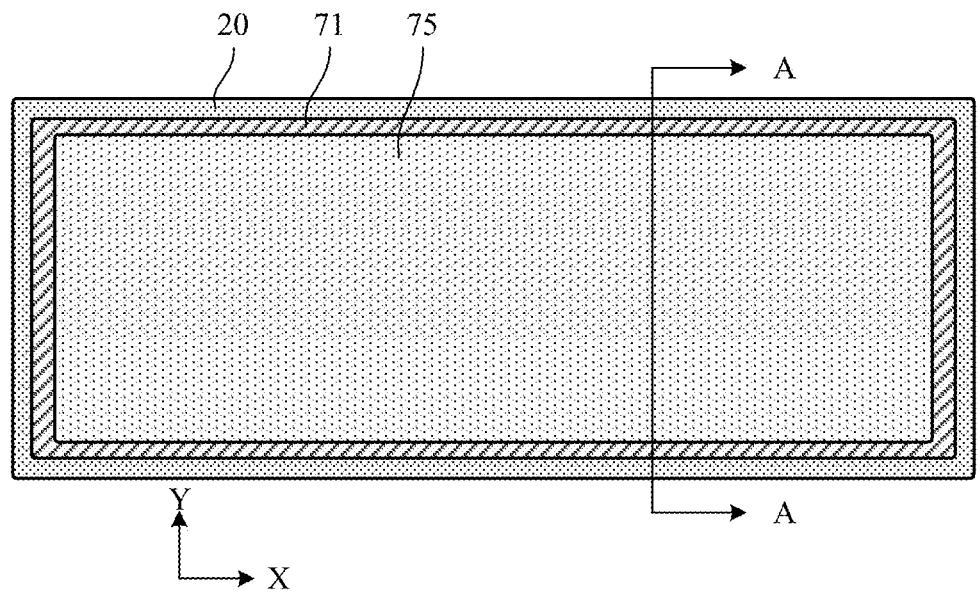
FIG. 25 is a schematic diagram of a planar structure of a planarization island and a photodiode according to an exemplary embodiment of the present disclosure.
Figure 26:
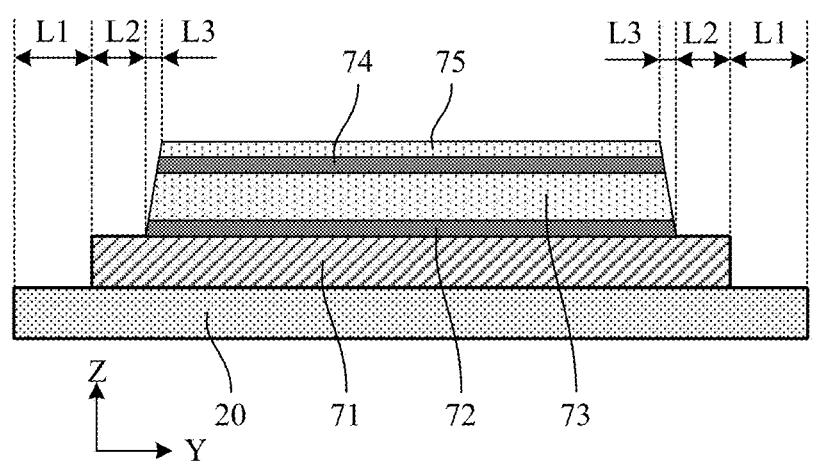
FIG. 26 is a sectional view taken along an A-A direction in FIG. 25.

FIG. 25 is a schematic top-view structural diagram of a planarization island and a photodiode according to an exemplary embodiment of the present disclosure, and FIG. 26 is a sectional view taken along an A-A direction in FIG. 25, wherein only parts of the planarization island and the photodiode of the display substrate are illustrated, and other film layer structures of the display substrate are not illustrated. As shown in FIG. 25, in a plane parallel to the base substrate, a shape of the planarization island 20 may be a rectangle, a long side of the rectangle extends along a first direction X, and a short side of the rectangle extends along a second direction Y, wherein the second direction Y intersects the first direction X. In an exemplary implementation mode, the first direction X may be an extension direction of a first scan signal line, and the second direction Y may be perpendicular to the first direction X. A shape of the first electrode 71 may be rectangular, similar to the shape of the planarization island 20, an area of the first electrode 71 may be less than or equal to an area of the planarization island 20, and an orthographic projection of the first electrode 71 on the base substrate may be within a range of an orthographic projection of the planarization island 20 on the base substrate. A shape of the second electrode 75 may be a rectangle, similar to the shape of the first electrode 71, an area of the second electrode 75 may be smaller than or equal to the area of the first electrode 71, and an orthographic projection of the second electrode 75 on the base substrate may be within a range of an orthographic projection of the first electrode 71 on the base substrate. As shown in FIG. 26, in a plane perpendicular to the base substrate, the first electrode 71 is disposed on a side of the planarization island 20 in a third direction Z, a first doped layer 72 is disposed on a side of the first electrode 71 in the third direction Z, an intrinsic layer 73 is disposed on a side of the first doped layer 72 in the third direction Z, a second doped layer 74 is disposed on a side of the intrinsic layer 73 in the third direction Z, and the second electrode 75 is disposed on a side of the second doped layer 74 in the third direction Z, wherein the third direction Z is a direction away from the base substrate.

In an exemplary implementation mode, shapes of the planarization island 20, the first electrode 71, and the second electrode 75 may be other shapes as long as they meet the foregoing projection relationships, and the present disclosure is not limited herein.

In an exemplary implementation mode, in the second direction Y, a width of the planarization island 20 may be greater than a width of the first electrode 71, and an orthographic projection of an edge of the first electrode 71 on the base substrate is within a range of an orthographic projection of an edge of the planarization island 20 on the base substrate. In an exemplary implementation mode, a first distance L1 between the edge of the first electrode 71 and the edge of the planarization island 20 may be about 2 μm to 4 μm. For example, the first distance L1 may be about 3 μm.

In an exemplary implementation mode, in the second direction Y, a width of the first electrode 71 may be greater than a width of the first doped layer 72, and an orthographic projection of an edge of the first doped layer 72 on the base substrate is within a range of an orthographic projection of an edge of the first electrode 71 on the base substrate. In an exemplary implementation mode, a second distance L2 between the edge of the first doped layer 72 and the edge of the first electrode 71 may be about 1 μm to 3 μm. For example, the second distance L2 may be about 2 μm.

In an exemplary implementation mode, in the second direction Y, a width of the first doped layer 72 may be greater than a width of the second electrode 75, and an orthographic projection of an edge of the second electrode 75 on the base substrate is within a range of an orthographic projection of an edge of the first doped layer 72 on the base substrate. In an exemplary implementation mode, a third distance L3 between the edge of the second electrode 75 and the edge of the first doped layer 72 may be about 0.5 μm to 2.5 μm. For example, the third distance L3 may be about 1.5 μm.

In an exemplary implementation mode, a distance (second distance L2+third distance L3) between the edge of the second electrode 75 and the edge of the first electrode 71 may be about 1.5 μm to 5.5 μm. For example, a sum of the second distance L2 and the third distance L3 may be about 3.5 μm.

As shown in FIG. 24, in conjunction with FIGS. 5 to 18, the base substrate of the exemplary embodiment of the present disclosure may include: a base substrate 10; a first metal layer disposed on the base substrate 10, wherein the first metal layer at least includes a first shield layer 31 located in a light emitting region A and a second shield layer 41 located in a sensing region B; an impurity absorption layer 100 covering the first metal layer; a first insulation layer 11 covering the impurity absorption layer 100; a semiconductor layer disposed on a side of the first insulation layer 11 away from the base substrate, the semiconductor layer at least includes a first active layer 32 located in the light emitting region A and a second active layer 42 located in the sensing region B; a second insulation layer 12 disposed on the semiconductor layer, and a second metal layer disposed on the second insulation layer 12, wherein the second metal layer at least includes a first gate electrode 33 located in the light emitting region A and a second gate electrode 43 located in the sensing region B; a third insulation layer 13 covering the second metal layer, a first via K1 exposing the first shield layer 31 and a second via K2 exposing the first active layer 32 are provided on the third insulation layer 13 of the light emitting region A, and a third via K3 exposing the second active layer 42 is provided on the third insulation layer 13 of the sensing region B; a third metal layer provided on the third insulation layer 13, the third metal layer at least includes a first source electrode 34 and a first drain electrode 35 located in the light emitting region A, and a second source electrode 44 and a second drain electrode 45 located in the sensing region B, the first source electrode 34 is connected with the first shield layer 31 through the first via K1, the first source electrode 34 and the first drain electrode 35 are respectively connected with the first active layer 32 through the second via K2, and the second source electrode 44 and the second drain electrode 45 are respectively connected with the second active layer 42 through the third via K3; a fourth insulation layer 14 covering the third metal layer and a planarization island 20 disposed on the fourth insulation layer 14, wherein the planarization island 20 is located in the sensing region B, the light emitting region A is provided with a fourth via K4 exposing the first drain electrode 35, and the sensing region B is provided with a fifth via K5 exposing the second drain electrode 45; a fourth metal layer disposed on the fourth insulation layer 14 and the planarization island 20, wherein the fourth metal layer at least includes a connection electrode 61 located in the light emitting region A and disposed on the fourth insulation layer 14, and a first electrode 71 located in the sensing region B and disposed on the planarization island 20, wherein the connection electrode 61 is connected with the first drain electrode 35 through the fourth via K4, and the first electrode 71 is connected with the second drain electrode 45 through the fifth via K5; a fifth insulation layer 15 covering the fourth metal layer and the planarization island 20, wherein the sensing region B is provided with a sixth via K6 exposing the first electrode 71; a first doped layer 72, an intrinsic layer 73, a second doped layer 74, and a second electrode 75 disposed on the first electrode 71; a sixth insulation layer 16 covering a photodiode; a second planarization layer 19 covering the sixth insulation layer 16, wherein the light emitting region A is provided with a seventh via K7 exposing the connection electrode 61, and the sensing region B is provided with an eighth via K8 exposing the second electrode 75; a second conductive layer provided on the second planarization layer 19, wherein the second conductive layer at least includes an anode 81 connected with the connection electrode 61 through the seventh via K7 and an electrode lead 91 connected with the second electrode 75 through the eighth via K8; a pixel definition layer 82 covering the second conductive layer, wherein the light emitting region A is provided with a first pixel opening V1 exposing the anode 81, and the sensing region B is provided with a second pixel opening V2 exposing the anode 81; an organic emitting layer 83 provided on the pixel definition layer 82, wherein the organic emitting layer 83 is connected with the anode 81 through the first pixel opening V1 and the second pixel opening V2; and a cathode 84 disposed on the organic emitting layer 83, wherein the cathode 84 is connected with the organic emitting layer 83.

The exemplary embodiment of the present disclosure may not only achieve same technical effects as aforementioned embodiments, including effectively reducing penetration of hydrogen elements, oxygen elements, and metal elements into an active layer of a transistor, reducing a negative bias degree of a first transistor as a whole, but also further reducing an influence of hydrogen elements on the active layer of the transistor. In a display substrate, a first planarization layer is generally provided on a fourth insulation layer, i.e. the first planarization layer covers the entire base substrate, only a via is provided at a corresponding position. It is found from research that a first planarization layer of an organic material (such as resin) itself contains a large amount of hydrogen elements, which will lead to downward penetration of a hydrogen element in a preparation process of a photodiode and a hydrogen element in the first planarization layer itself together, and a penetration amount of hydrogen elements is relatively large, which has a relatively great influence on an active layer. According to the exemplary embodiment of the present disclosure, an island-shaped planarization island is provided on a fourth insulation layer, the planarization island is disposed in a sensing region B. Since an area of the planarization island is reduced, not only an amount of hydrogen elements in an organic material is reduced as a whole, but also release space of hydrogen elements is increased. In subsequent baking, the planarization island has larger space to release hydrogen elements therein, hydrogen elements contained in the planarization island and hydrogen elements in the preparation process of the photodiode are released in large quantities, effectively reducing an amount of hydrogen elements penetrating downward and effectively reducing an influence on an active layer. Since a first electrode is provided on a side of the planarization island away from the base substrate and a first distance between an edge of the first electrode and an edge of the planarization island is about 2 µm to 4 µm, the first electrode of a metal material may effectively reduce most of hydrogen elements in preparation entering the planarization island, further reduce hydrogen element content in the planarization island, further reduce an amount of hydrogen elements penetrating downward, and further decrease an influence on an active layer.

Figure 27:
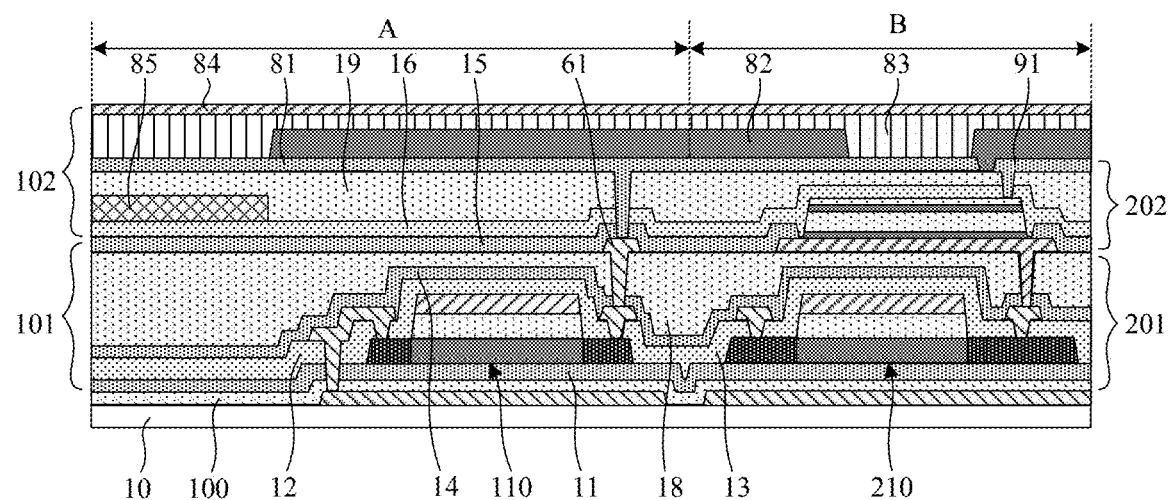
FIG. 27 is a schematic diagram of a sectional structure of yet another display substrate according to an exemplary embodiment of the present disclosure.

FIG. 27 is a schematic diagram of a sectional structure of yet another display substrate according to an exemplary embodiment of the present disclosure. As shown in FIG. 27, a main body structure of the base substrate of this exemplary embodiment is similar to that of the foregoing embodiments, and includes a drive circuit layer 101 and an emitting structure layer 102 disposed in a light emitting region A, and a sensing circuit layer 201 and a photoelectric structure layer 202 disposed in a sensing region B. The drive circuit layer 101 and the sensing circuit layer 201 include transistors and an impurity absorption layer 100, wherein an atomic ratio of a silicon element to a nitrogen element in the impurity absorption layer 100 is 1:5 to 1:35, and an atomic ratio of a silicon element to a hydrogen element is 1:5 to 1:30. The impurity absorption layer is configured to reduce penetration of hydrogen elements, oxygen elements, and metal elements into the transistors in the drive circuit layer 101 and the sensing circuit layer 201, so as to ensure normal electrical characteristics of the transistors, thereby avoiding a large number of bright spots on the display substrate and improving a yield. Different from the foregoing embodiments, a color film layer 85 is provided in the emitting structure layer 102 of this exemplary embodiment.

In an exemplary implementation mode, the emitting structure layer 102 may include an anode 81, a pixel definition layer 82, an organic emitting layer 83, a cathode 84, and a color film layer 85. Structures of the anode 81, the pixel definition layer 82, the organic emitting layer 83, and the cathode 84 are similar to those of the foregoing embodiments, the color film layer 85 may be disposed on a side of a sixth insulation layer 16 away from the base substrate, and a second planarization layer 19 covers the color film layer 85.

In an exemplary implementation mode, organic emitting layers of different sub-pixels may emit light of a same color, such as white light or blue light. In an exemplary implementation mode, hole injection layers, hole transport layers, electron block layers, emitting layers, hole block layers, electron transport layers, and electron injection layers of all sub-pixels may be a common layer communicated together, and an organic emitting layer may be formed using open mask evaporation or using an ink-jet process.

In an exemplary implementation mode, the color film layer 85 is configured to filter or convert light emitted by the organic emitting layer into light of a corresponding color, and color film layers of different sub-pixels may filter or convert out light of different colors, such as red light, green light, and blue light. For example, a color film layer in a sub-pixel that filters or converts out red light may be made of a red color film or a red quantum dot material, a color film layer in a sub-pixel for filtering or converting out green light may be made of a green color film or a green quantum dot material, and a color film layer in a sub-pixel for filtering or converting out blue light may be made of a blue color film or a blue quantum dot material. Light emitted by an organic emitting layer in a first pixel opening region passes through a color film layer, is filtered out or converted into light of a corresponding color, and is emitted from a side of the base substrate away from a drive circuit layer to achieve image display.

A preparation process of the base substrate of this exemplary embodiment is similar to that of the foregoing embodiments, a difference is that after a sixth insulation thin film covering a PIN photodiode is deposited, a color film layer 85 is formed on the sixth insulation thin film of the light emitting region A, and then a planarization thin film is coated, and the planarization thin film covers the color film layer 85. Then patterning is performed through a patterning process to form a pattern of a sixth insulation layer 16 covering the PIN photodiode, a pattern of the color film layer 85 disposed on the sixth insulation layer 16, and a pattern of a second planarization layer 19 covering the color film layer 85 and the sixth insulation layer 16.

Structures and preparation processes thereof shown in the present disclosure are only exemplary illustrations, and the display substrate of the present disclosure may be applied to other display apparatuses having pixel drive circuits, such as quantum dot display, and the present disclosure is not limited herein. In an exemplary implementation mode, corresponding structures may be changed and patterning processes may be added or reduced according to actual needs. For example, multiple impurity absorption layers may be provided, and impurity absorption layers may be provided simultaneously on a side of an active layer away from the base substrate and on a side of the active layer close to the base substrate. For another example, an impurity absorption layer may be patterned to form an impurity absorption island, and a position of the impurity absorption islands corresponds to a position of an active layer. For another example, the display substrate may be a top emission type display substrate, which is not limited in the present disclosure.

The present disclosure further provides a preparation method of a display substrate. In an exemplary implementation mode, the preparation method may include: forming a circuit layer on a base substrate; wherein the circuit layer includes at least one impurity absorption layer and at least one transistor, the transistor includes an active layer, and at least one insulation layer is provided between the impurity absorption layer and the active layer; an atomic ratio of a silicon element to a nitrogen element in the impurity absorption layer is 1:5 to 1:35; and forming an emitting structure layer and a photoelectric structure layer on the circuit layer.

In an exemplary implementation mode, the forming the circuit layer on the base substrate may include: forming a first metal layer on the base substrate; depositing an impurity absorption thin film on a side of the first metal layer away from the base substrate, performing a plasma treatment on the impurity absorption thin film to form the impurity absorption layer covering the first metal layer; forming a first insulation layer on a side of the impurity absorption layer away from the base substrate; and forming a first transistor and a second transistor on a side of the first insulation layer away from the base substrate.

In an exemplary implementation mode, the depositing the impurity absorption thin film may include: depositing an impurity absorption thin film with a thickness of 200 Å to 1000 Å in a chemical vapor deposition manner under a deposition power of 500 W to 1200 W, a deposition temperature of 330° C. to 450° C., and a deposition pressure of 1000 mT to 1800 mT, a material of the impurity absorption thin film includes any one or more of following: silicon nitride, silicon oxynitride, and silicon aluminum nitride.

In an exemplary implementation mode, the performing the plasma treatment on the impurity absorption thin film may include: performing a plasma treatment on the impurity absorption thin film using nitrous oxide under a plasma power of 600 W to 1500 W and a plasma pressure of 600 mT to 2000 mT.

The present disclosure provides a preparation method of a display substrate. By disposing an impurity absorption layer between a metal layer and a buffer layer, penetration of hydrogen elements, oxygen elements, and metal elements into an active layer of a transistor may be effectively reduced, thereby effectively ensuring electrical stability of the transistor and uniformity of electrical characteristics of the transistor, which effectively avoids a large number of bright spots on the display substrate, and improves a yield and a display effect. The preparation method of the display substrate according to the exemplary embodiment of the present disclosure has simple process and good process compatibility, which helps to ensuring display uniformity and reducing a production cost.

The present disclosure further provides a display apparatus including the display substrate of the aforementioned embodiments. The display apparatus may be any product or component with a display function, such as a mobile phone, a tablet computer, a television, a display, a laptop computer, a digital photo frame, or a navigator.

Although the implementation modes disclosed in the present disclosure are as above, the described contents are only implementation modes used for convenience of understanding the present disclosure and are not intended to limit the present disclosure. Any person skilled in the art to which the present disclosure pertains, without departing from the spirit and scope disclosed in the present disclosure, may make any modifications and changes in a form and details of implementation. However, the scope of patent protection of the present application should still be subject to the scope defined by the appended claims.

The invention claimed is:

1. A display substrate, comprising a circuit layer disposed on a base substrate and an emitting structure layer and a photoelectric structure layer disposed on a side of the circuit layer away from the base substrate, wherein the circuit layer comprises an impurity absorption layer and a plurality of transistors, each transistor comprises an active layer, and a first insulation layer is provided between the impurity absorption layer and the active layer; and an atomic ratio of a silicon element to a nitrogen element in the impurity absorption layer is 1:5 to 1:35.

2. The display substrate according to claim 1, wherein the atomic ratio of the silicon element to the nitrogen element in the impurity absorption layer is 1:10 to 1:25.

3. The display substrate according to claim 2, wherein the display substrate comprises a light emitting region and a sensing region; the circuit layer comprises a drive circuit layer disposed in the light emitting region and a sensing circuit layer disposed in the sensing region, the drive circuit layer comprises a first transistor, the sensing circuit layer comprises a second transistor, the emitting structure layer is disposed on a side of the drive circuit layer away from the base substrate, and the photoelectric structure layer is disposed on a side of the sensing circuit layer away from the base substrate; the emitting structure layer comprises an anode, an organic emitting layer, and a cathode; the photoelectric structure layer comprises a photodiode and an electrode lead; and the anode is arranged in a same layer as the electrode lead.

4. The display substrate according to claim 1, wherein an atomic ratio of the silicon element to a hydrogen element in the impurity absorption layer is 1:5 to 1:30.

5. The display substrate according to claim 4, wherein the display substrate comprises a light emitting region and a sensing region; the circuit layer comprises a drive circuit layer disposed in the light emitting region and a sensing circuit layer disposed in the sensing region, the drive circuit layer comprises a first transistor, the sensing circuit layer comprises a second transistor, the emitting structure layer is disposed on a side of the drive circuit layer away from the base substrate, and the photoelectric structure layer is disposed on a side of the sensing circuit layer away from the base substrate; the emitting structure layer comprises an anode, an organic emitting layer, and a cathode; the photoelectric structure layer comprises a photodiode and an electrode lead; and the anode is arranged in a same layer as the electrode lead.

6. The display substrate according to claim 4, wherein the atomic ratio of the silicon element to the hydrogen element in the impurity absorption layer is 1:5 to 1:15.

7. The display substrate according to claim 6, wherein the display substrate comprises a light emitting region and a sensing region; the circuit layer comprises a drive circuit layer disposed in the light emitting region and a sensing circuit layer disposed in the sensing region, the drive circuit layer comprises a first transistor, the sensing circuit layer comprises a second transistor, the emitting structure layer is disposed on a side of the drive circuit layer away from the base substrate, and the photoelectric structure layer is disposed on a side of the sensing circuit layer away from the base substrate; the emitting structure layer comprises an anode, an organic emitting layer, and a cathode; the photoelectric structure layer comprises a photodiode and an electrode lead; and the anode is arranged in a same layer as the electrode lead.

8. The display substrate according to claim 1, wherein a material of the impurity absorption layer comprises any one or more of following: silicon nitride, silicon oxynitride, and silicon aluminum nitride.

9. The display substrate according to claim 8, wherein the display substrate comprises a light emitting region and a sensing region; the circuit layer comprises a drive circuit layer disposed in the light emitting region and a sensing circuit layer disposed in the sensing region, the drive circuit layer comprises a first transistor, the sensing circuit layer comprises a second transistor, the emitting structure layer is disposed on a side of the drive circuit layer away from the base substrate, and the photoelectric structure layer is disposed on a side of the sensing circuit layer away from the base substrate; the emitting structure layer comprises an anode, an organic emitting layer, and a cathode; the photoelectric structure layer comprises a photodiode and an electrode lead; and the anode is arranged in a same layer as the electrode lead.

10. The display substrate according to claim 1, wherein the display substrate comprises a light emitting region and a sensing region; the circuit layer comprises a drive circuit layer disposed in the light emitting region and a sensing circuit layer disposed in the sensing region, the drive circuit layer comprises a first transistor, the sensing circuit layer comprises a second transistor, the emitting structure layer is disposed on a side of the drive circuit layer away from the base substrate, and the photoelectric structure layer is disposed on a side of the sensing circuit layer away from the base substrate; the emitting structure layer comprises an anode, an organic emitting layer, and a cathode; the photoelectric structure layer comprises a photodiode and an electrode lead; and the anode is arranged in a same layer as the electrode lead.

11. The display substrate according to claim 10, wherein a thickness of the impurity absorption layer is 200 Å to 1000 Å and a thickness of the photodiode is 0.8 µm to 1.2 µm.

12. The display substrate according to claim 10, wherein the drive circuit layer comprises: a first shield layer disposed on the base substrate, the impurity absorption layer disposed on a side of the first shield layer away from the base substrate, the first insulation layer disposed on a side of the impurity absorption layer away from the base substrate, and the first transistor disposed on a side of the first insulation layer away from the base substrate; the sensing circuit layer comprises: a second shield layer disposed on the base substrate, the impurity absorption layer disposed on a side of the second shield layer away from the base substrate, the first insulation layer disposed on a side of the impurity absorption layer away from the base substrate, and the second transistor disposed on a side of the first insulation layer away from the base substrate.

13. The display substrate according to claim 12, wherein the first transistor comprises: a first active layer disposed on a side of the first insulation layer away from the base substrate, a second insulation layer disposed on a side of the first active layer away from the base substrate, a first gate electrode disposed on a side of the second insulation layer away from the base substrate, a third insulation layer disposed on a side of the first gate electrode away from the base substrate, a first source electrode and a first drain electrode disposed on a side of the third insulation layer away from the base substrate, and the first source electrode is connected with the first shield layer through a via; a second active layer of the second transistor is arranged in a same layer as the first active layer, a second gate electrode of the second transistor is arranged in a same layer as the first gate electrode, and a second source electrode and a second drain electrode of the second transistor are arranged in a same layer as the first source electrode and the first drain electrode.

14. The display substrate according to claim 13, wherein the sensing circuit layer further comprises a fourth insulation layer disposed on a side of the second transistor away from the base substrate, a planarization island disposed on a side of the fourth insulation layer away from the base substrate, the planarization island is disposed in the sensing region, and the photodiode is disposed on a side of the planarization island away from the base substrate.

15. The display substrate according to claim 14, wherein the photodiode comprises a first electrode disposed on a side of the planarization island away from the base substrate, and a first doped layer, an intrinsic layer, a second doped layer, and a second electrode disposed in sequence on the first electrode, the first electrode is connected with a second drain electrode of the second transistor through a via, and the second electrode is connected with the electrode lead through a via; each of the planarization island, the first electrode, and the second electrode is in a shape of a rectangle with a long side extending along a first direction; in a second direction, an orthographic projection of an edge of the first electrode on the base substrate is within a range of an orthographic projection of an edge of the planarization island on the base substrate, and a first distance between the edge of the first electrode and the edge of the planarization island is 2 µm to 4 µm; an orthographic projection of an edge of the second electrode on the base substrate is within a range of the orthographic projection of the edge of the first electrode on the base substrate, and a distance between the edge of the second electrode and the edge of the first electrode is 1.5 µm to 5.5 µm; wherein the second direction intersects the first direction.

16. A display apparatus, comprising the display substrate according to claim 1.

17. A preparation method of a display substrate, comprising:
forming a circuit layer on a base substrate; wherein the circuit layer comprises an impurity absorption layer and a plurality of transistors, the each transistor comprises an active layer, and a first insulation layer is provided between the impurity absorption layer and the active layer; and an atomic ratio of a silicon element to a nitrogen element in the impurity absorption layer is 1:5 to 1:35; and
forming an emitting structure layer and a photoelectric structure layer on the circuit layer.

18. The preparation method according to claim 17, wherein the forming the circuit layer on the base substrate comprises:
forming a first metal layer on the base substrate;
depositing an impurity absorption thin film on a side of the first metal layer away from the base substrate, performing a plasma treatment on the impurity absorption thin film to form the impurity absorption layer covering the first metal layer;
forming the first insulation layer on a side of the impurity absorption layer away from the base substrate; and
forming a first transistor and a second transistor on a side of the first insulation layer away from the base substrate.

19. The preparation method according to claim 18, wherein the depositing the impurity absorption thin film comprises: depositing the impurity absorption thin film with a thickness of 200 Å to 1000 Å in a chemical vapor deposition manner under a deposition power of 500 W to 1200 W, a deposition temperature of 330° C. to 450° C., and a deposition pressure of 1000 mT to 1800 mT, a material of the impurity absorption thin film comprises any one or more of following: silicon nitride, silicon oxynitride, and silicon aluminum nitride.

20. The preparation method according to claim 18, wherein the performing the plasma treatment on the impurity absorption thin film comprises: performing the plasma treatment on the impurity absorption thin film using nitrous oxide under a plasma power of 600 W to 1500 W and a plasma pressure of 600 mT to 2000 mT.

* * * * *